US011594645B1

(12) United States Patent
Lin et al.

(10) Patent No.: US 11,594,645 B1
(45) Date of Patent: Feb. 28, 2023

(54) TRANSISTOR AND METHOD FOR MANUFACTURING THE SAME

(71) Applicant: Taiwan Semiconductor Manufacturing Company, Ltd., Hsinchu (TW)

(72) Inventors: Yu-Chu Lin, Tainan (TW); Wen-Chih Chiang, Hsinchu (TW); Chi-Chung Jen, Kaohsiung (TW); Ming-Hong Su, Tainan (TW); Mei-Chen Su, Hsinchu (TW); Chia-Wei Lee, Kaohsiung (TW); Kuan-Wei Su, Kaohsiung (TW); Chia-Ming Pan, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/446,556

(22) Filed: Aug. 31, 2021

(51) Int. Cl.
*H01L 29/788* (2006.01)
*H01L 29/06* (2006.01)
*H01L 27/11517* (2017.01)
*H01L 29/423* (2006.01)

(52) U.S. Cl.
CPC ...... *H01L 29/788* (2013.01); *H01L 27/11517* (2013.01); *H01L 29/0649* (2013.01); *H01L 29/42324* (2013.01)

(58) Field of Classification Search
CPC ............ H01L 29/788; H01L 27/11517; H01L 29/0649; H01L 29/42324
USPC ......................................................... 257/316
See application file for complete search history.

(56) References Cited

U.S. PATENT DOCUMENTS

| 2018/0233509 | A1* | 8/2018 | Cai ................... H01L 29/42336 |
| 2020/0105775 | A1* | 4/2020 | Huang ................ H01L 29/4916 |

* cited by examiner

Primary Examiner — Theresa T Doan
(74) Attorney, Agent, or Firm — Harrity & Harrity, LLP

(57) ABSTRACT

Some implementations described herein provide a semiconductor structure. The semiconductor structure includes a first terminal coupled to a substrate of the semiconductor structure. The first terminal comprises a tunneling layer formed on the substrate, a first conductive structure formed on the tunneling layer, and a dielectric structure formed on a top surface and on a first curved side surface of the first conductive structure. The semiconductor structure includes a second terminal coupled to the substrate. The second terminal comprises a second conductive structure formed on an isolation structure. The second conductive structure has a second curved side surface, and the dielectric structure is disposed between the first curved side surface and the second curved side surface.

14 Claims, 17 Drawing Sheets

TRANSISTOR AND METHOD FOR MANUFACTURING THE SAME

BACKGROUND

A transistor is a common type of semiconductor structure in electronic devices that is able to amplify and/or switch electrical signals. A transistor may be configured with three terminals to receive one or more applications of voltage. A voltage applied to a first terminal associated with a gate may control a current across a second terminal associated with a source voltage and a third terminal associated with a drain voltage. The transistor may be configured to perform different operations based on applications of different combinations of voltages to the terminals. For example, the transistor may perform a programming operation, a read operation, or an erase operation when different combinations of voltages are applied to the terminals of the transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
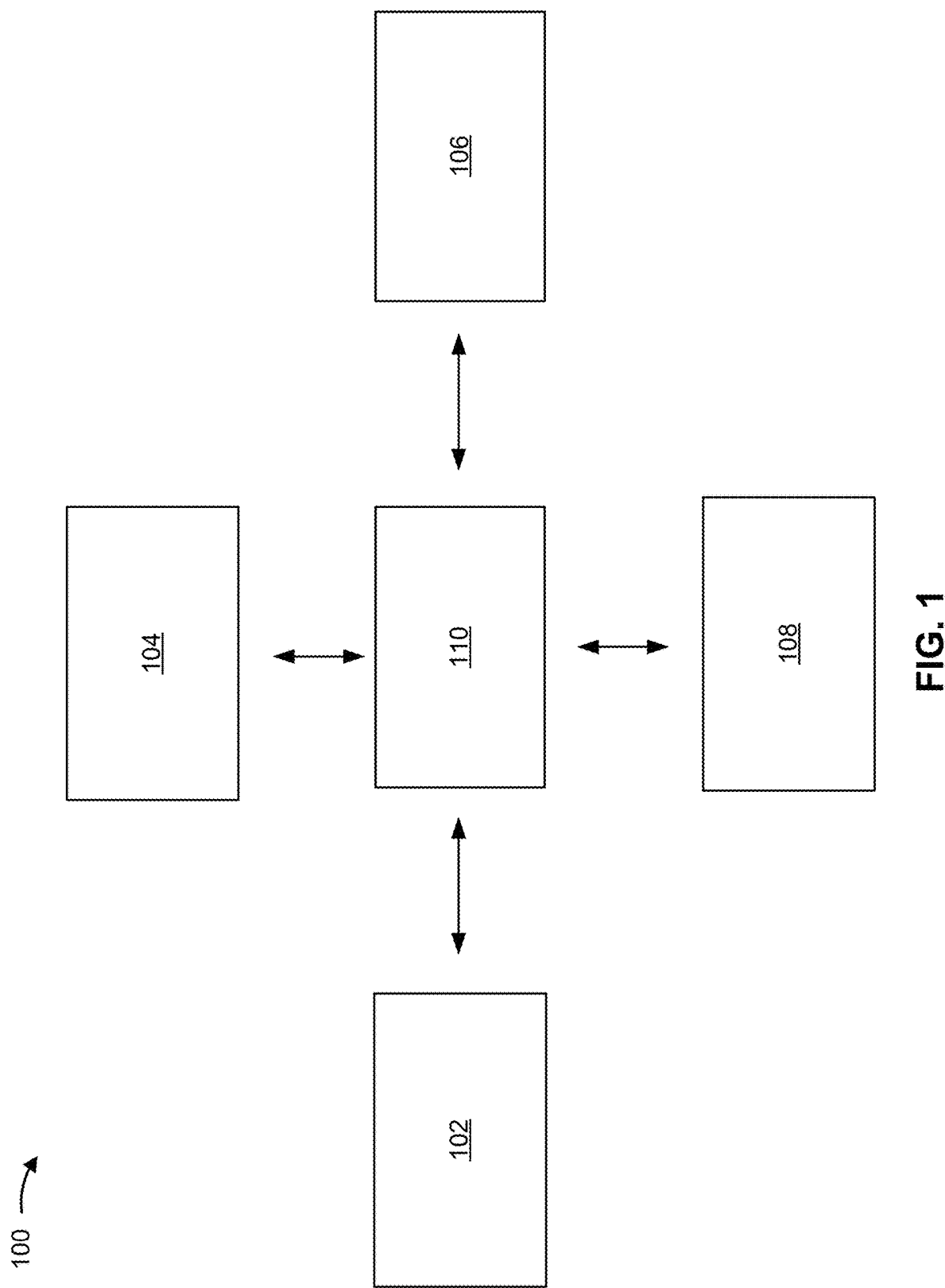
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a semiconductor structure may include a gate structure that includes a control gate and a floating gate in a stacked configuration. Based on the gate structure being in a stacked configuration, the gate structure may extend to a height above a substrate of the semiconductor structure that is relatively high (e.g., in comparison with another device, such as a logic device disposed in a same level of the semiconductor structure). The height of the gate structure being relatively high may cause an increased likelihood of deterioration of a dielectric structure disposed between a top surface of the gate structure and an electrode that provides a voltage to the gate structure (e.g., based on a decreased thickness of the dielectric structure), which may cause shorting and/or other failures of the semiconductor structure. Additionally, or alternatively, the stacked configuration may provide a stress on a tunneling oxide material disposed between the gate structure and the substrate of the semiconductor structure. This stress may be caused for each transistor-based operation of the semiconductor structure (e.g., programming, reading, and erasing) being performed based on application of a voltage difference across the tunneling oxide material. The stress may cause deterioration of the tunneling oxide, shorting across the tunneling oxide, and/or another failure of the semiconductor structure.

Some implementations described herein provide techniques and apparatuses for a semiconductor structure that includes a transistor having a lateral configuration of gates. The semiconductor structure may include a substrate having a source/drain and/or one or more doped portions disposed therein. The semiconductor structure may be configured with a set of terminals to couple components of the semiconductor structure to voltage sources. A first gate terminal may include a first portion of a tunneling layer, a first gate, and a dielectric structure disposed on top and one or both sides of the first gate. The first gate may include a first curved side surface and, in some implementations, an additional curved side surface. A second gate terminal may include a second gate having a second curved side surface that is disposed adjacent to the first curved side surface, with the dielectric structure disposed between the first curved side surface and the second curved side surface. In some implementations, the first curved side surface and the second curved surface may be complementary. For example, the first curve surface may be concave and the second curved surface may be convex, or the first curve surface may be convex and the second curved surface may be concave. In some implementations, the second gate may be disposed on an isolation structure within, or on top of, the substrate.

Based on the first gate having a curved side surface that interfaces with a curved side surface of the second gate, an interface between the first gate and the second gate may have an increased surface area in comparison with a planar interface. The increased surface area may improve coupling, decrease impedance (e.g., resistance) at the interface, and/or reduce a voltage difference between the gate structures required to perform a transistor operation (e.g., an erasing operation). Additionally, based on the semiconductor structure having gates arranged laterally (e.g., instead of in a stacked configuration), the gates may have heights that are relatively low in comparison with gates in a stacked configuration. With the gates having heights that are relatively low, the semiconductor structure may have a reduced likelihood of deterioration of a dielectric structure disposed between a top surface of the gates and electrodes that provide voltages to the gate structures (e.g., based on an increased thickness of the dielectric structure), which may reduce a likelihood of shorting and/or other failures of the semiconductor structure. Additionally, or alternatively, the gates having heights that are relatively low may improve deposition processes (e.g., reduce errors, cost, and/or cycle times) based on the gates having a same or similar height as other single-layer devices within the semiconductor structure (e.g., a logic device using a same material as the gates). This may facilitate a reduced number of deposition operations to deposit material of the gates for various devices of the semiconductor structure. Further, based on the gates being arranged laterally with different terminals, the semiconductor structure may be configured to perform one or more operations based on providing a voltage difference across the dielectric structure, instead of based on providing a voltage difference across the tunneling oxide. This may reduce stress on the tunneling oxide, which may increase a life cycle of the semiconductor structure.

FIG. 1 is a diagram of an example environment 100 in which systems and/or methods described herein may be implemented. As shown in FIG. 1, environment 100 may include a plurality of semiconductor processing tools 102-108 and a wafer/die transport tool 110. The plurality of semiconductor processing tools 102-108 may include a deposition tool 102, an etching tool 104, a planarization tool, and/or an ion implantation tool 108. The plurality of semiconductor processing tools 102-108 included in example environment 100 may be included in a semiconductor clean room, a semiconductor foundry, a semiconductor processing and/or manufacturing facility, and/or the like.

Deposition tool 102 is a semiconductor processing tool that is capable of depositing various types of materials onto a substrate. In some implementations, deposition tool 102 includes a spin coating tool that is capable of depositing a photoresist layer on a substrate such as a wafer. In some implementations, deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, deposition tool 102 includes a physical vapor deposition (PVD) tool, such as a sputtering tool or another type of PVD tool. In some implementations, the example environment 100 includes a plurality of types of deposition tools 102.

Etching tool 104 is a semiconductor processing tool that is capable of etching various types of materials of a substrate, wafer, or semiconductor structure. For example, etching tool 104 may include a wet etching tool, a dry etching tool, and/or another type of etching tool. A wet etching tool may include a chemical etching tool or another type of wet etching tool that includes a chamber filled with an etchant. The substrate may be placed in the chamber for a particular time period to remove particular amounts of one or more portions of the substrate. A dry etching tool may include a plasma etching tool, a laser etching tool, a reactive ion etching tool, or a vapor phase etching tool, among other examples. A dry etching tool may remove one or more portions of a substrate using a sputtering technique, a plasma-assisted etch technique (e.g., a plasma sputtering technique or another type of technique involving the use of an ionized gas to isotropically or directionally etch the one or more portions), or another type of dry etching technique.

Planarization tool 106 is a semiconductor processing tool that is capable of polishing or planarizing various layers of a wafer or semiconductor structure. For example, planarization tool 106 may be configured to polish or planarize a layer or surface of deposited or plated material. planarization tool 106 may polish or planarize a surface of a semiconductor structure with a combination of chemical and mechanical forces (e.g., chemical etching and free abrasive polishing). Planarization tool 106 may utilize an abrasive and corrosive chemical slurry in conjunction with a polishing pad and retaining ring (e.g., typically of a greater diameter than the semiconductor structure). The polishing pad and the semiconductor structure may be pressed together by a dynamic polishing head and held in place by the retaining ring. The dynamic polishing head may rotate with different axes of rotation to remove material and even out any irregular topography of the semiconductor structure, making the semiconductor structure flat or planar.

An ion implantation tool 108 is a semiconductor processing tool that is capable of implanting ions into a substrate such as a semiconductor wafer. The ion implantation tool 108 generates ions in an arc chamber from a source material such as a gas or a solid. The source material is provided into the arc chamber, and an arc voltage is discharged between a cathode and an electrode to produce a plasma containing ions of the source material. One or more extraction electrodes are used to extract the ions from the plasma in the arc chamber and accelerate the ions to form an ion beam. The ion beam may be directed toward the substrate such that the ions are implanted below the surface of the substrate to dope the substrate.

Wafer/die transport tool 110 includes a mobile robot, a robot arm, a tram or rail car, an overhead hoist transfer (OHT) vehicle, an automated material handling system (AMHS), and/or another type of tool that is used to transport wafers and/or dies between semiconductor processing tools 102-108 and/or to and from other locations such as a wafer rack, a storage room, and/or the like. In some implementations, wafer/die transport tool 110 may be a programmed tool to travel a particular path and/or may operate semi-autonomously or autonomously.

The number and arrangement of tools shown in FIG. 1 are provided as one or more examples. In practice, there may be additional tools, fewer tools, different tools, or differently arranged tools than those shown in FIG. 1. Furthermore, two or more tools shown in FIG. 1 may be implemented within a single tool, or a single tool shown in FIG. 1 may be implemented as multiple, distributed tools. Additionally, or alternatively, a set of tools (e.g., one or more tools) of environment 100 may perform one or more functions described as being performed by another set of tools of environment 100.

Figure 2:
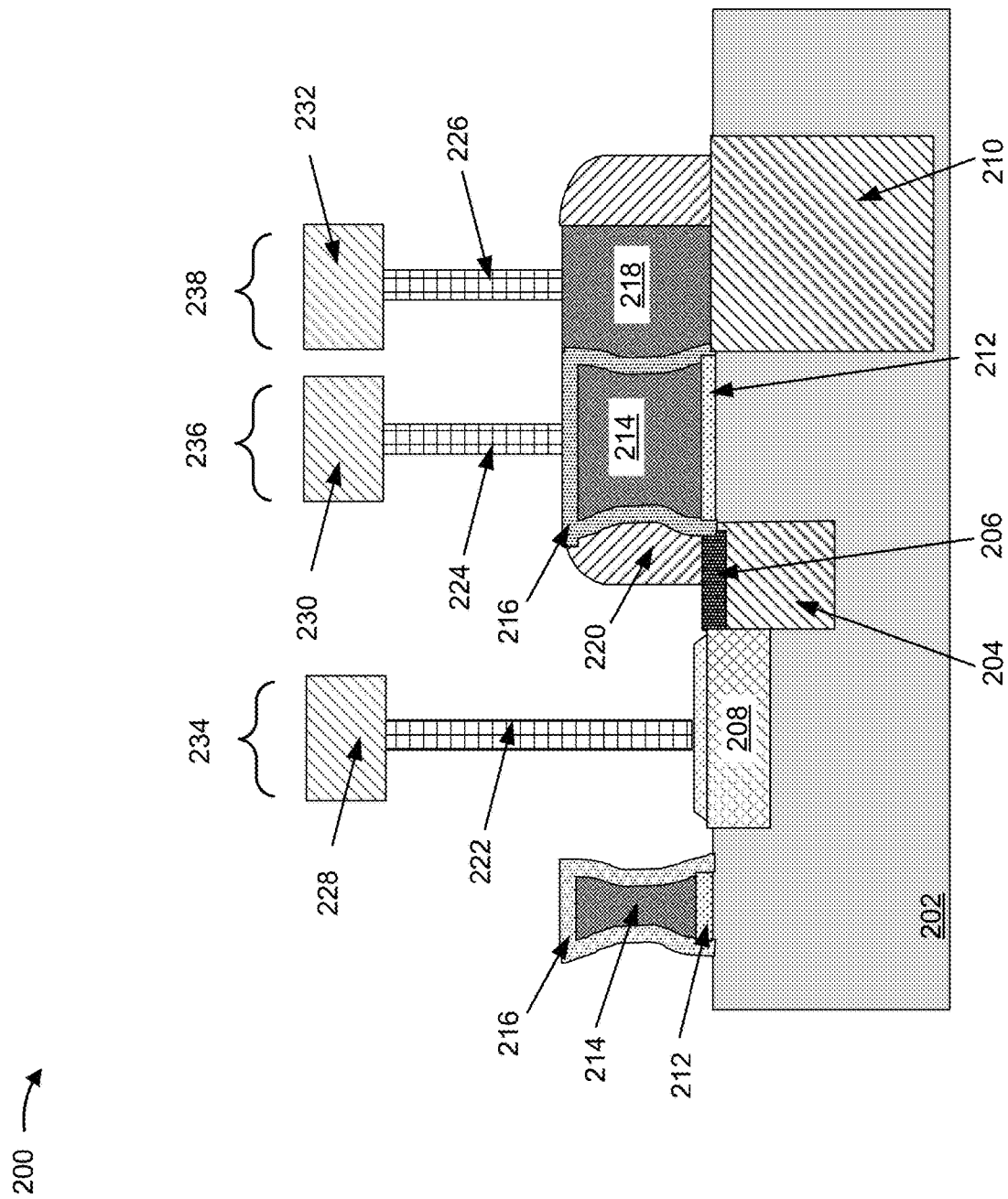
FIG. 2 is a diagram of an example semiconductor structure described herein.

FIG. 2 is a diagram of an example semiconductor structure 200 described herein. In some implementations, the semiconductor structure 200 includes one or more layers not shown in FIG. 2, such as one or more barrier layers, adhesion layers, metal gates, substrates, interconnects, recesses (e.g., vias), or dielectric structures, among other examples. In some implementations, the semiconductor structure 200 may omit (e.g., not include) one or more layers shown in FIG. 2. In some implementations, one or more structures and/or layers shown in FIG. 2 may have a different shape and/or position than those shown in FIG. 2.

As shown in FIG. 2, the semiconductor structure 200 may include a substrate 202. The substrate 202 may include a semiconductor die substrate, a semiconductor wafer, or another type of substrate in and/or on which semiconductor devices may be formed. In some implementations, the substrate 202 is formed of silicon (Si), a material including silicon, a III-V compound semiconductor material such as gallium arsenide (GaAs), a silicon on insulator (SOI), or another type of semiconductor material. The substrate 202 may include a doped portion 204, a lightly doped drain (LDD) portion 206, a source/drain 208, and an isolation structure 210. In some implementations, one or more portions of the substrate 202, or structures within the substrate 202 (e.g., the isolation structure 210), may be disposed fully within the substrate 202 or may at least partially extend above a top surface of the substrate 202.

In some implementations, the doped portion 204 may be doped with a p-type doping (e.g., using ion implantation tool 108). The doped portion 204 may include a doped silicon material that has an increased conductivity (e.g., electrical conductivity) in comparison with other portions of the substrate 202. In some implementations, the doped portion 204 may be configured to create a conducting path between the source/drain 208 and a terminal (e.g., terminal 236) of the semiconductor structure 200. In some implementations, a threshold voltage (Vt) may be needed to conduct (e.g., electrically conduct) through the doped portion 204 between the source/drain 208 and the terminal of the semiconductor structure 200.

In some implementations, the LDD portion 206 may be disposed above the doped portion 204. The LDD portion 206 may be doped with an n-type doping (e.g., using ion implantation tool 108). The LDD portion 206 may include a doped silicon material that has an increased conductivity (e.g., electrical conductivity) in comparison with other portions of the substrate 202, but lower conductivity than the doped portion 204. The LDD portion 206 may improve parasitic capacitance between one or more gates of the semiconductor structure 200 and/or with the substrate 202 (e.g., the doped portion 204). Additionally, or alternatively, the LDD portion 206 may reduce a likelihood of generating a hot electron effect within the substrate 202.

In some implementations, the source/drain 208 may be configured to drain a charge from the substrate 202 and/or to provide a voltage to the substrate 202. The source/drain 208 may be formed based on using an n-type doping of the substrate 202.

In some implementations, the isolation structure 210 may include a doped portion of the substrate 202 and/or one or more insulating layers. For example, the isolation structure 210 may include a p-type doped portion and/or one or more layers of dielectric material, such as silicon oxide or silicon dioxide, among other examples. In some implementations, the isolation structure 210 may include a deep trench isolation (DTI) structure or a shallow trench isolation (STI) structure, among other examples. In some implementations, the isolation structure 210 may include insulating material disposed on a top surface of the substrate 202 (rather than being disposed below a top surface of the substrate 202). In some implementations, the isolation structure 210 may include insulating material that is disposed both below a top surface of the substrate 202 and with at least a portion of the insulating material extending above the top surface of the substrate 202.

The isolation structure 210 may include an anti-punch-through structure that is configured to provide sufficient insulation to prevent, or substantially prevent, current and/or charging effects between the substrate 202 and a structure above the isolation structure 210 (e.g., a conductive structure 218) and/or between portions of the substrate 202 on opposite sides of the isolation structure 210.

The semiconductor structure 200 may include a tunneling layer 212 disposed on a top surface of the substrate 202. The tunneling layer 212 may include an oxide-based material (e.g., a tunneling oxide material, such as a silicon oxide material and/or aluminum oxide material). The tunneling layer 212 may support voltage interactions (e.g., capacitance and/or charging, among other examples) between the substrate 202 and a gate (e.g., a conductive structure 214) above the tunneling layer 212 and may reduce current between the substrate 202 and the gate above the tunneling layer 212.

The semiconductor structure 200 may include a conductive structure 214 formed (e.g., disposed) on the tunneling layer 212. In some implementations, the conductive structure 214 may include a gate, such as a metal gate or a polysilicon-based gate (e.g., having polysilicon-based material), among other examples. The conductive structure 214 may have at least one curved side surface. For example, the conductive structure 214 may have a curved side surface that faces away from the source/drain 208 and/or toward another conductive structure (e.g., the conductive structure 218) and/or toward the isolation structure 210. The conductive structure 214 may have one or more additional curved side surfaces, such as a curved side surface that faces toward the source/drain 208.

Based on the conductive structure 214 having at least one curved side surface, the conductive structure 214 has a side surface with a surface area that is greater than a vertical and/or planar side surface. Based on the at least one curved side surface having a surface area that is greater than a vertical and/or planar side surface, the at least one curved side surface may provide improved coupling, and/or a reduced impedance, with an adjacent conductive structure (e.g., the conductive structure 218). This may reduce an amount of voltage difference that is required to perform a transistor operation across the conductive structure 214 and the adjacent conductive structure.

In some implementations, the curved side surface and/or the one or more additional curved side surfaces may be concave side surfaces (e.g., having a lateral recess in a middle portion). In some implementations, the conductive structure 214 may include a first concave surface and a second concave surface that is opposite the first concave surface. The first concave surface or the second concave surface may face an adjacent conductive structure (e.g., conductive structure 218). In some implementations, the conductive structure 214 may include a first concave surface that faces an adjacent conductive structure and a second surface, opposite the first concave surface, that is generally planar.

In a situation where the curved side surface and/or the one or more additional curved side surfaces are concave side surfaces, the conductive structure 214 may have a width of a top portion that is at least 6% greater than a width of the middle portion. In some implementations, the width of the top portion may be measured at a height of the conductive structure 214 that is approximately 25% of a total height of the conductive structure 214 from a top surface of the conductive structure 214, and/or the width of the middle portion may be measured at a height of the conductive structure 214 that is approximately 50% of a total height of the conductive structure 214 from the top surface of the conductive structure 214. Additionally, or alternatively, the conductive structure 214 may have a width of a bottom portion that is at least 3% greater than the width in the middle portion. In some implementations, the width of the bottom portion may be measured at a height of the conductive structure 214 that is approximately 75% of the total height of the conductive structure 214 from the top surface of the conductive structure 214.

In some implementations, the curved side surface and/or the one or more additional curved side surfaces may be convex side surfaces (e.g., having a lateral protrusion from the middle portion). In a situation where the curved side surface and/or the one or more additional curved side surfaces are convex side surfaces, the width of the top portion may be at least 6% less than the width of the middle portion. Additionally, or alternatively, the width of the bottom portion may be at least 3% less than the width in the middle portion. In some implementations, the conductive structure 214 may include a first convex surface and a second convex surface that is opposite the first convex surface. The first convex surface or the second convex surface may face an adjacent conductive structure (e.g., conductive structure 218). In some implementations, the conductive structure 214 may include a first convex surface that faces an adjacent conductive structure and a second surface, opposite the first convex surface, that is generally planar.

In some implementations, the conductive structure 214 may have a thickness (e.g., a height) that is greater than approximately 800 angstroms. For example, the conductive structure 214 may have a thickness that is in a range of approximately 800 angstroms to approximately 1,000 angstroms. In this way, a side surface of the conductive structure 214 may be sufficiently tall to couple to another conductive structure (e.g., conductive structure 218) during operations of the semiconductor structure 200. In some implementations, the conductive structure 214 may have an average width (e.g., a critical dimension) that is in a range of approximately 75 angstroms to approximately 95 angstroms. Based on having a width that is less than approximately 95 angstroms, the semiconductor structure 200 may have an improved device density and/or may support a short enough distance between terminals of the semiconductor structure 200 to perform operations with a sufficiently low voltage requirement to avoid unnecessary consumption of power resources.

The semiconductor structure 200 may include a dielectric structure 216 disposed on one or more side surfaces and/or a top surface of the conductive structure 214. In some implementations, the dielectric structure 216 may be disposed on all side surfaces of the conductive structure 214. In some implementations, the dielectric structure 216 may be disposed on the curved side surface of the conductive structure 214 that faces away from the source/drain 208 (e.g., and/or toward the conductive structure 218). Additionally, or alternatively, a bottom surface of a portion of the dielectric structure 216 may be disposed on the isolation structure 210. In this way, a structure disposed on a surface of the isolation structure 210 (e.g., conductive structure 218) may be insulated from the substrate 202, the tunneling layer 212, and the conductive structure 214.

The dielectric structure 216 may include a single layer of material (e.g., a silicon oxide material or a silicon nitride material) or multiple layers of material. For example, the dielectric structure 216 may include an oxide-nitride-oxide (ONO) structure having a first oxide-based layer, a silicon nitride-based layer disposed on the first oxide-based layer, and a second oxide-based layer disposed on the silicon-nitride based layer. The ONO structure may be formed with thicknesses of layers such that a total thickness of the two oxide layers may be between 100% and 150% of a thickness of the nitride layer to improve dielectric characteristics of the dielectric structure. In some implementations, the nitride layer may include a range of approximately 5%-15% of concentration of nitrogen in the nitride layer. The dielectric structure 216 may have a thickness in a range of approximately 100 angstroms to 160 angstroms. In this way, the dielectric structure 216 may be sufficiently thick to resist current between the conductive structure 214 and other conductive structures, and may be sufficiently thin to allow for charging effects (e.g., capacitance) across the dielectric structure 216.

The semiconductor structure 200 may include a conductive structure 218 formed (e.g., disposed) on the isolation structure 210. In some implementations, the conductive structure 218 may include a gate, such as a metal gate or a polysilicon-based gate, among other examples. The conductive structure 218 may have at least one curved side surface. For example, the conductive structure 218 may have a curved side surface that faces toward the conductive structure 214 and/or the source/drain 208. In this way, the dielectric structure 216 may be disposed between the curved surface of the conductive structure 214 and the curved surface of the conductive structure 218.

The conductive structure 218 may have one or more additional curved side surfaces, such as a curved side surface that faces away from the conductive structure 214 and/or the source/drain 208. In some implementations, the curved side surface of the conductive structure 218 that faces toward the conductive structure 214 may be complementary to the curved side surface of the conductive structure 214 that faces toward the conductive structure 218. For example, the curved side surface of the conductive structure 218 may be convex and the curved side surface of the conductive structure 214 may be concave, or the curved side surface of the conductive structure 218 may be concave and the curved side surface of the conductive structure 214 may be convex.

In some implementations, the curved side surface and/or the one or more additional curved side surfaces may be concave side surfaces (e.g., having a lateral recess in a middle portion). In a situation where the curved side surface and/or the one or more additional curved side surfaces are concave side surfaces, the width of a top portion may be at least 6% greater than the width of the middle portion. Additionally, or alternatively, the width of a bottom portion may be at least 3% greater than the width in the middle portion. In some implementations, the conductive structure 218 may include a first concave surface and a second concave surface that is opposite the first concave surface. The first concave surface or the second concave surface may face the conductive structure 214. In some implementations, the conductive structure 218 may include a first concave surface that faces the conductive structure 214 and a second surface, opposite the first concave surface, that is generally planar.

In some implementations, the curved side surface and/or the one or more additional curved side surfaces may be convex side surfaces (e.g., having a lateral protrusion from the middle portion). In a situation where the curved side surface and/or the one or more additional curved side surfaces are convex side surfaces, the width of the top portion may be at least 6% less than the width of the middle portion. Additionally, or alternatively, the width of the bottom portion may be at least 3% less than the width in the middle portion. In some implementations, the conductive structure 218 may include a first convex surface and a second convex surface that is opposite the first convex surface. The first convex surface or the second convex surface may face the conductive structure 214. In some implementations, the conductive structure 218 may include a first convex surface that faces the conductive structure 214 and a second surface, opposite the first convex surface, that is generally planar.

In some implementations, the conductive structure 218 may have a thickness (e.g., a height) that is greater than a thickness of the conductive structure 214. In some implementations, the conductive structure 218 may have a thickness such that the conductive structure 218 and a top portion of the dielectric structure 216 extend to approximately a same height relative to a top surface of the substrate 202 of the semiconductor structure 200. For example, the conductive structure 218 may have a thickness in a range from approximately 900 angstroms to approximately 1,160 angstroms. In this way, a side surface of the conductive structure 218 may be sufficiently tall to couple to the conductive structure 214 during operations of the semiconductor structure 200 and/or may provide a generally planar surface with the top surface of the dielectric structure 216. Based on providing a generally planar surface with the top surface of the dielectric structure 216, a material (e.g., an interlayer dielectric material) disposed above the conductive structure 218 and the top portion of the dielectric structure 216 may be generally planar, which may improve structural integrity of the material.

In some implementations, the isolation structure 210 may be configured to provide an electrical resistance between the conductive structure 218 and the substrate 202, with the provided electrical resistance being greater than an electrical resistance provided by the dielectric structure 216 between the conductive structure 218 and the conductive structure 214. In this way, the conductive structure 218 may interact electrically (e.g., provide a charging and/or capacitive function) with the conductive structure 214 without, or substantially without, interacting electrically with the substrate 202.

The semiconductor structure 200 may include one or more spacers 220 that provide structural support, an electromigration barrier, and/or electrical insulation (e.g., to prevent write disturbance and/or reverse tunneling) to the conductive structures 214 and/or 218. In some aspects, the one or more spacers 220 may include a silicon-based material, such as a silicon nitride material.

The semiconductor structure 200 may include conductive structures 222, 224, and/or 226 to provide electrical connections to components of the semiconductor structure 200. The conductive structures 222, 224, and/or 226 may include a conductive material, such as copper, tungsten, ruthenium, titanium, tantalum, and/or a silicide-based material. The conductive structure 222 may provide an electrical connection to the source/drain 208. The conductive structure 224 may provide an electrical connection to the dielectric structure 216 at a top surface of the conductive structure 214 (e.g., to provide a charge to the conductive structure 214). The conductive structure 226 may provide an electrical connection to the conductive structure 218.

The semiconductor structure 200 may include conductive structures (electrodes) 228, 230, and/or 232 that are configured to couple components of the semiconductor structure 200 to voltage sources. The conductive structures 228, 230, and/or 232 may include a conductive material, such as copper. The conductive structure 228 may be configured to couple the conductive structure 222 to a first voltage source, the conductive structure 230 may be configured to couple the conductive structure 224 to a second voltage source, and/or the conductive structure 232 may be configured to couple the conductive structure 226 to a third voltage source.

Components of the semiconductor structure 200 may be referred to as terminals of the semiconductor structure. A terminal 234 (e.g., a bit line terminal) may include the conductive structure 228 and the conductive structure 222 coupled to the source/drain 208. A terminal 236 (e.g., a control gate terminal) may include the conductive structure 230, the conductive structure 224, the dielectric structure 216, the conductive structure 214, and the tunneling layer 212 formed on the substrate 202. A terminal 238 (e.g., an erase gate terminal) may include the conductive structure 232, the conductive structure 226, and the conductive structure 218 formed on the isolation structure 210.

The semiconductor structure 200 may be configured to receive a first voltage at the terminal 236, a second voltage at the terminal 238, and a third voltage at the terminal 234. The semiconductor structure 200 may be configured to perform a programming operation based on the first voltage being greater than the second voltage and the second voltage being greater than the third voltage. For example, the semiconductor structure 200 may perform a programming operation based on application of a voltage of approximately −2 microvolts (e.g., 0 volts) to the terminal 234, a voltage of approximately 8.7 volts applied to the terminal 236, and a voltage of approximately 4 volts applied to the terminal 238.

The semiconductor structure 200 may be configured to perform an erasing operation based on the first voltage and the third voltage being less than the second voltage. In some implementations, the semiconductor structure 200 may be configured to perform the erasing operation based on a voltage difference between the conductive structure 214 (e.g., the terminal 236) and the conductive structure 218 (e.g., the terminal 238) being greater than a voltage difference between the conductive structure 214 (e.g., the terminal 236) and the source/drain 208 (e.g., terminal 234). For example, the semiconductor structure 200 may perform an erasing operation based on application of a voltage of approximately 0 volts to the terminal 236, a voltage of approximately 0 volts to the terminal 234, and a voltage of approximately 10.5 volts applied to the terminal 238.

In some implementations, the semiconductor structure 200 may include a third conductive structure (e.g., a dummy structure) that includes a portion of the conductive structure 214. The third conductive structure may further include a portion of the tunneling layer 212 and/or a portion of the dielectric structure 216. In some implementations, the third conductive structure may provide structural support and/or may reduce an isolation and/or dense bias effect on the semiconductor structure 200. In some implementations, a distance from the third conductive structure to the conductive structure 214 may be in a range of approximately 8 micrometers to 12 micrometers to provide sufficient lateral separation from the source/drain 208 and also to reduce the isolation and/or dense bias effect on the semiconductor structure 200.

As indicated above, FIG. 2 is provided as examples. Other examples may differ from what is described with regard to FIG. 2.

FIGS. 3A-3H are diagrams of an example processes for forming a semiconductor structure (e.g., semiconductor structure 200) described herein. The semiconductor structure 200 may include a transistor. FIGS. 3A-3H include a top view 302, a Y cross-section view 304, and an X cross-section view 306 of the semiconductor structure 200. The semiconductor structure 200 may include one or more additional devices, structures, and/or layers not shown in FIGS. 3A-3H.

Figure 3A:
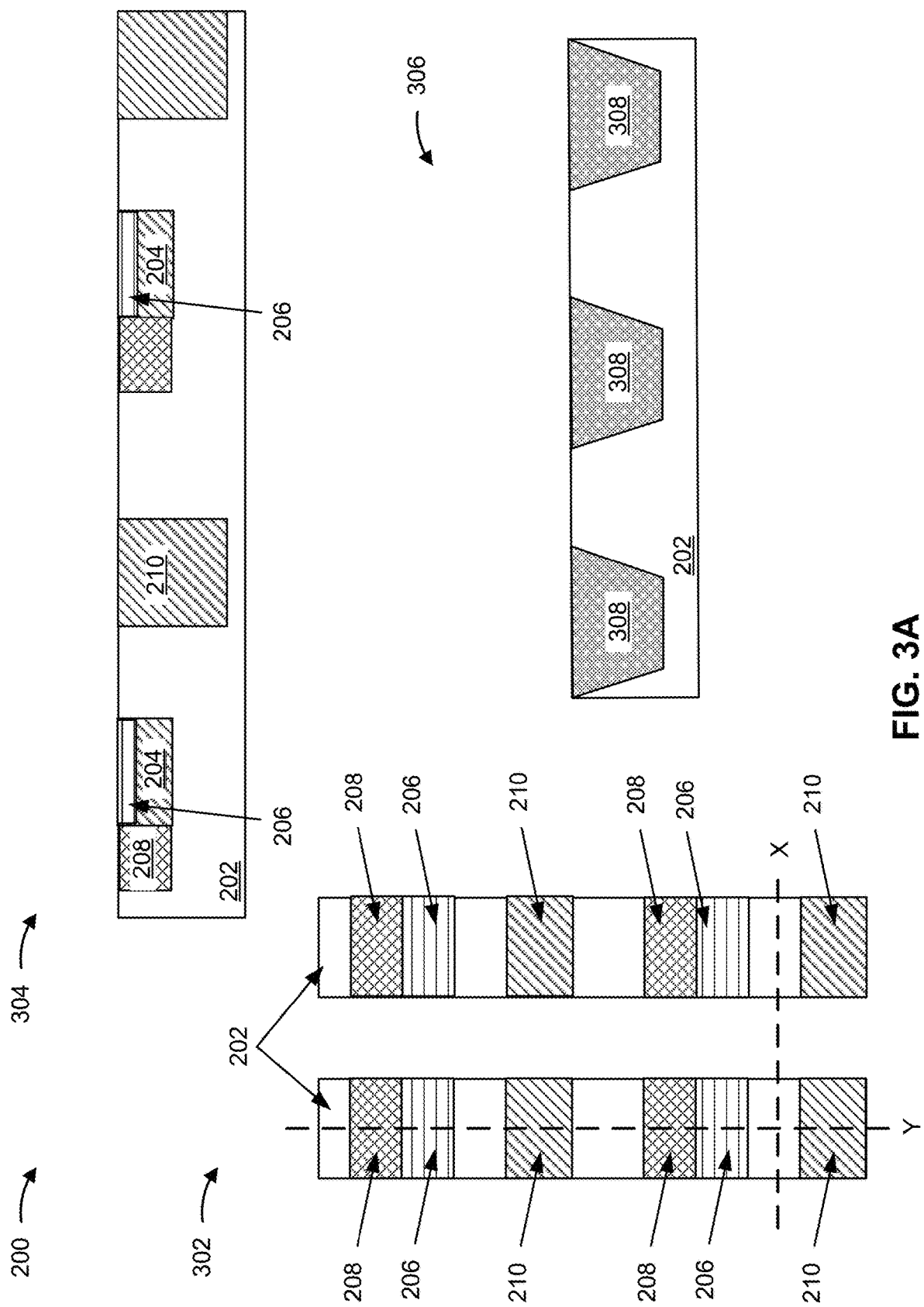
FIGS. 3A-3H are diagrams of an example process for forming a semiconductor structure described herein.

As shown in FIG. 3A, semiconductor structure 200 may include forming a substrate 202 having a doped portion 204, an LDD portion 206 disposed on a top portion of the doped portion 204, a source/drain 208, and an isolation structure 210. In some implementations, an ion implantation tool (e.g., ion implantation tool 108) may dope one or more portions of the substrate 202 to form the doped portion 204, the LDD portion 206, and/or the source/drain 208. In some implementations, the ion implantation tool may use n-doping (e.g., with phosphorus) and/or p-doping (e.g., with boron) to increase conductivity of first portions of the substrate 202 and/or to decrease conductivity of second portions of the substrate 202 (e.g., the isolation structure 210).

In some implementations, an etching tool (e.g., etching tool 104) may etch a portion of the substrate 202 to form one or more recesses in which one or more trench isolation structures 308 (e.g., a deep trench isolation structure) may be formed. In some implementations, a deposition tool (e.g., deposition tool 102) may deposit the one or more trench isolation structures 308 within the one or more recesses. In some implementations, a planarization tool (e.g., planarization tool 106) may polish and/or planarize upper surfaces of the substrate 202 and/or the one or more trench isolation structures 308. In some implementations, the one or more trench isolation structures 308 may provide insulation within the substrate 202 between sets of devices (e.g., sets of transistors and/or logic devices in a row) of the semiconductor structure 200.

Figure 3B:
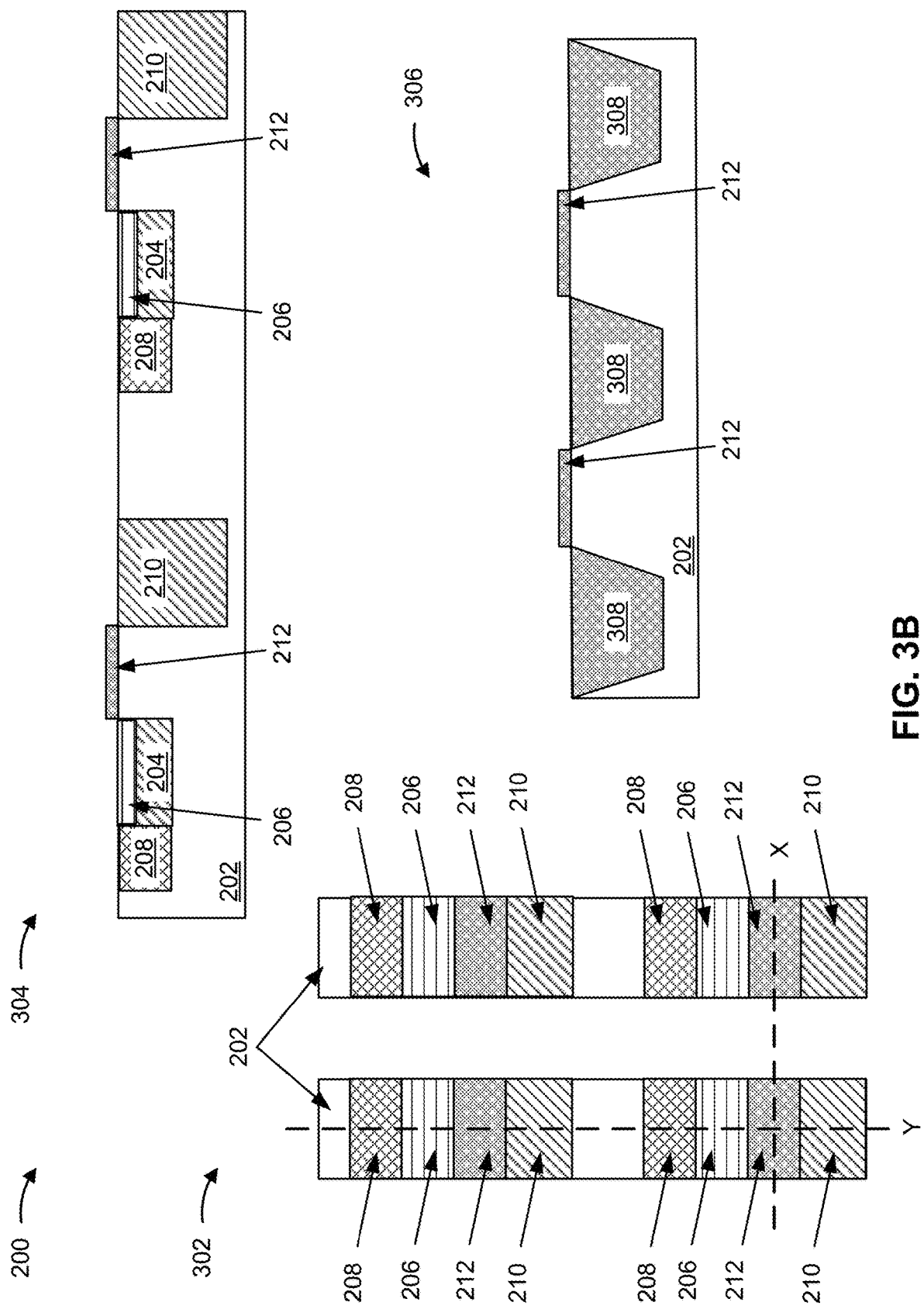

As shown in FIG. 3B, semiconductor structure 200 may include a tunneling layer 212 (e.g., a tunneling oxide) on the substrate 202 of the semiconductor structure 200. In some implementations, a deposition tool (e.g., deposition tool 102) may deposit the tunneling layer 212 on the substrate 202. The deposition tool may deposit the tunneling layer 212 to provide an electrically insulating layer, or a partially electrically insulating layer, between the substrate 202 and structures above the tunneling layer 212.

Figure 3C:
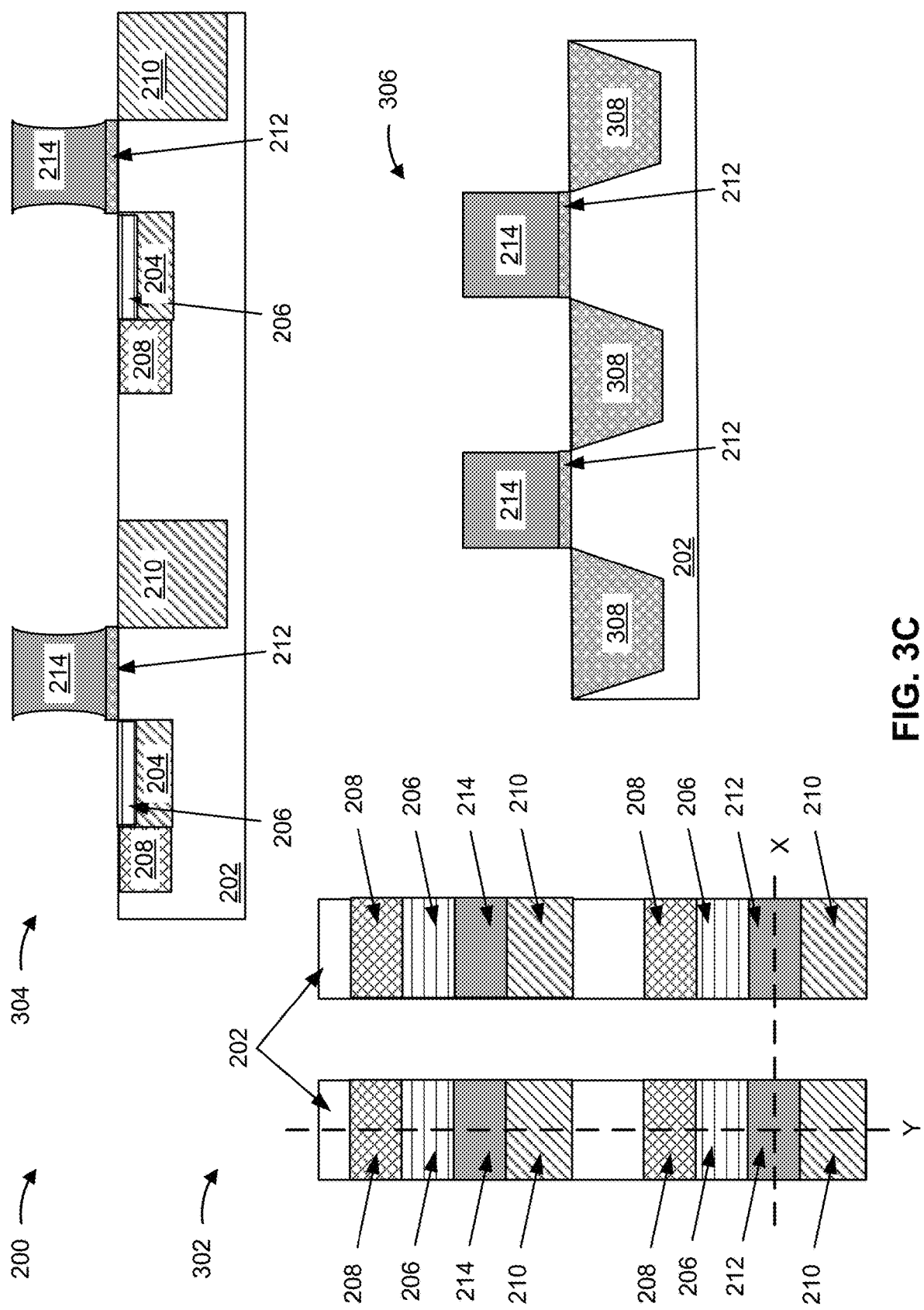

As shown in FIG. 3C, semiconductor structure 200 may include a conductive structure 214 (e.g., a gate) on the tunneling layer 212. In some implementations, a deposition tool (e.g., deposition tool 102) may deposit the conductive structure 214 on the tunneling layer 212. The deposition tool may deposit the conductive structure 214 to provide a conductive material that may store charge and/or may be configured with a voltage for operations of the semiconductor structure 200. In some implementations, an etching tool (e.g., etching tool 104) may etch a portion of a side surface of the conductive structure 214 to form one or more curved side surfaces of the conductive structure 214. For example, the etching tool may form the one or more curved surfaces of the conductive structure 214 based on performing an etch process using a high polymer gas. In some implementations, deposition of the conductive structure 214 may include a set of processes including forming a dielectric layer, forming a recess within the dielectric layer, depositing the conductive structure 214 into the recess, removing the dielectric layer, and/or performing further etching to form the one or more curved side surfaces. In some implementations, a planarization tool (e.g., planarization tool 106) may polish and/or planarize a top surface of the conductive structure 214 after a deposition process.

Figure 3D:
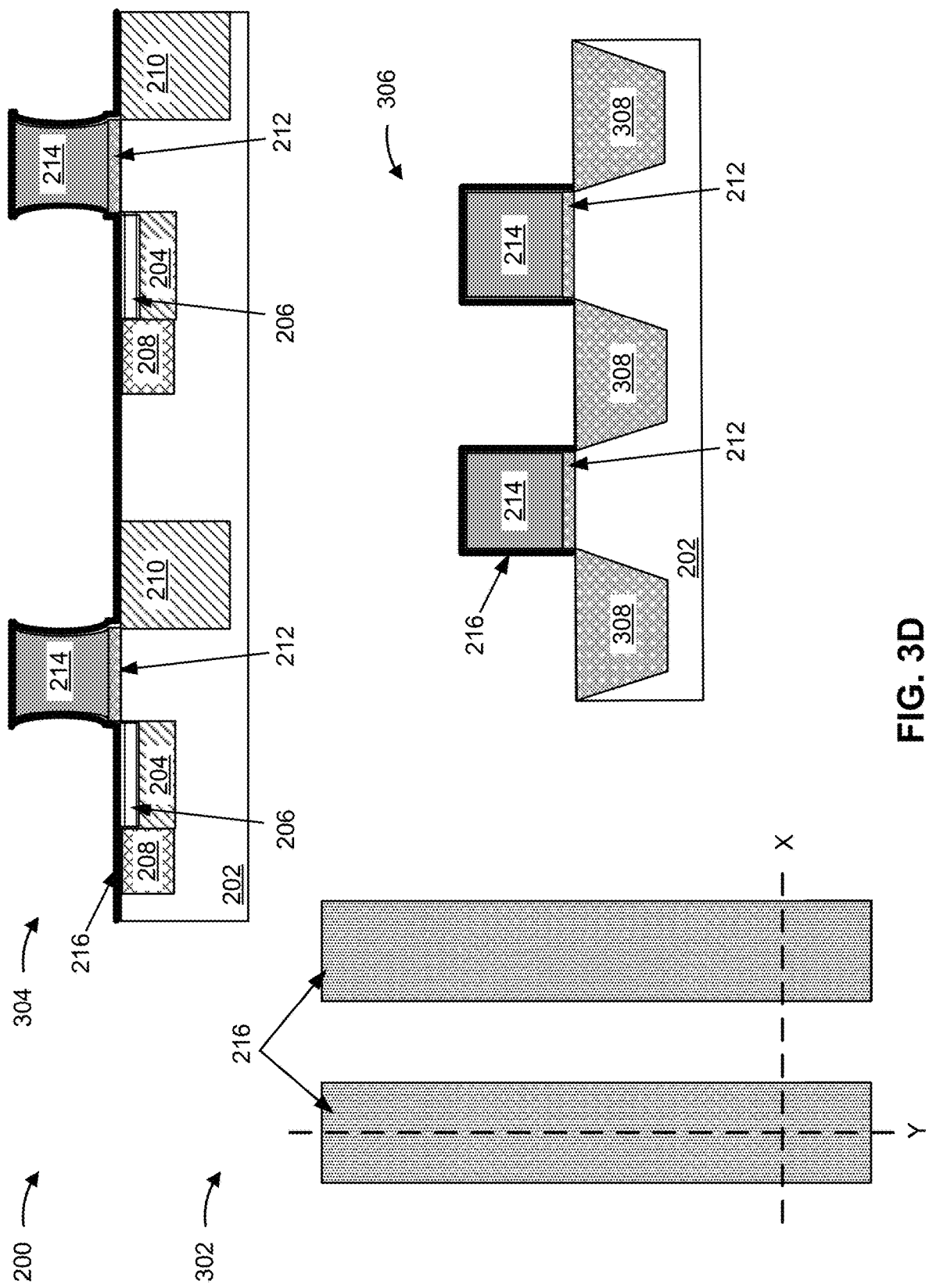

As shown in FIG. 3D, semiconductor structure 200 may include a dielectric structure 216 on the substrate 202, on the tunneling layer 212, and/or on the conductive structure 214 of the semiconductor structure 200. In some implementations, a deposition tool (e.g., deposition tool 102) may deposit the dielectric structure 216 on the substrate 202 and/or on the conductive structure 214. The deposition tool may deposit the dielectric structure 216 to provide an electrically insulating layer, or a partially electrically insulating layer, between the substrate 202 and/or on the conductive structure 214 and structures above the dielectric structure 216. In some implementations, the dielectric structure 216 may have a generally uniform thickness and/or may include one or more curved (e.g., concave or convex) portions on one or more curved side surfaces of the conductive structure 214. A process of depositing the dielectric structure 216 may include multiple deposition processes, such as depositing a first layer (e.g., a first oxide-based layer), depositing a second layer (e.g., a nitride-based layer), and/or depositing a third layer (e.g., a second oxide-based layer).

Figure 3E:
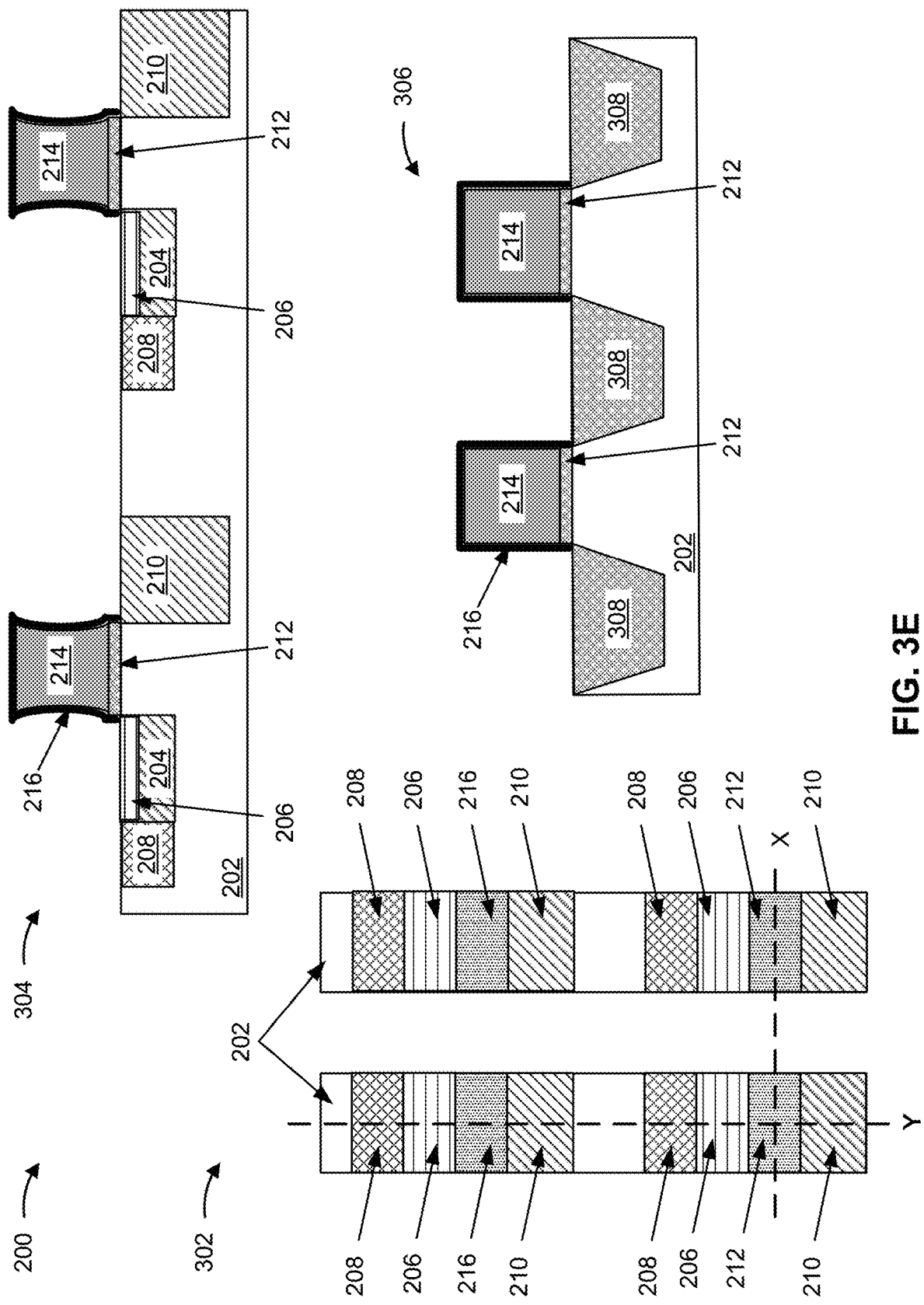

As shown in FIG. 3E, semiconductor structure 200 may include removing a portion of the dielectric structure 216. In some implementations, an etching tool (e.g., etching tool 104) may etch the portion of the dielectric structure 216. As further shown in FIG. 3E, the etching tool may remove the portion of the dielectric structure 216 from a top surface of the substrate 202. In some implementations, a remaining portion of the dielectric structure 216 may be disposed on a top surface and on side surfaces of the conductive structure 214.

Figure 3F:
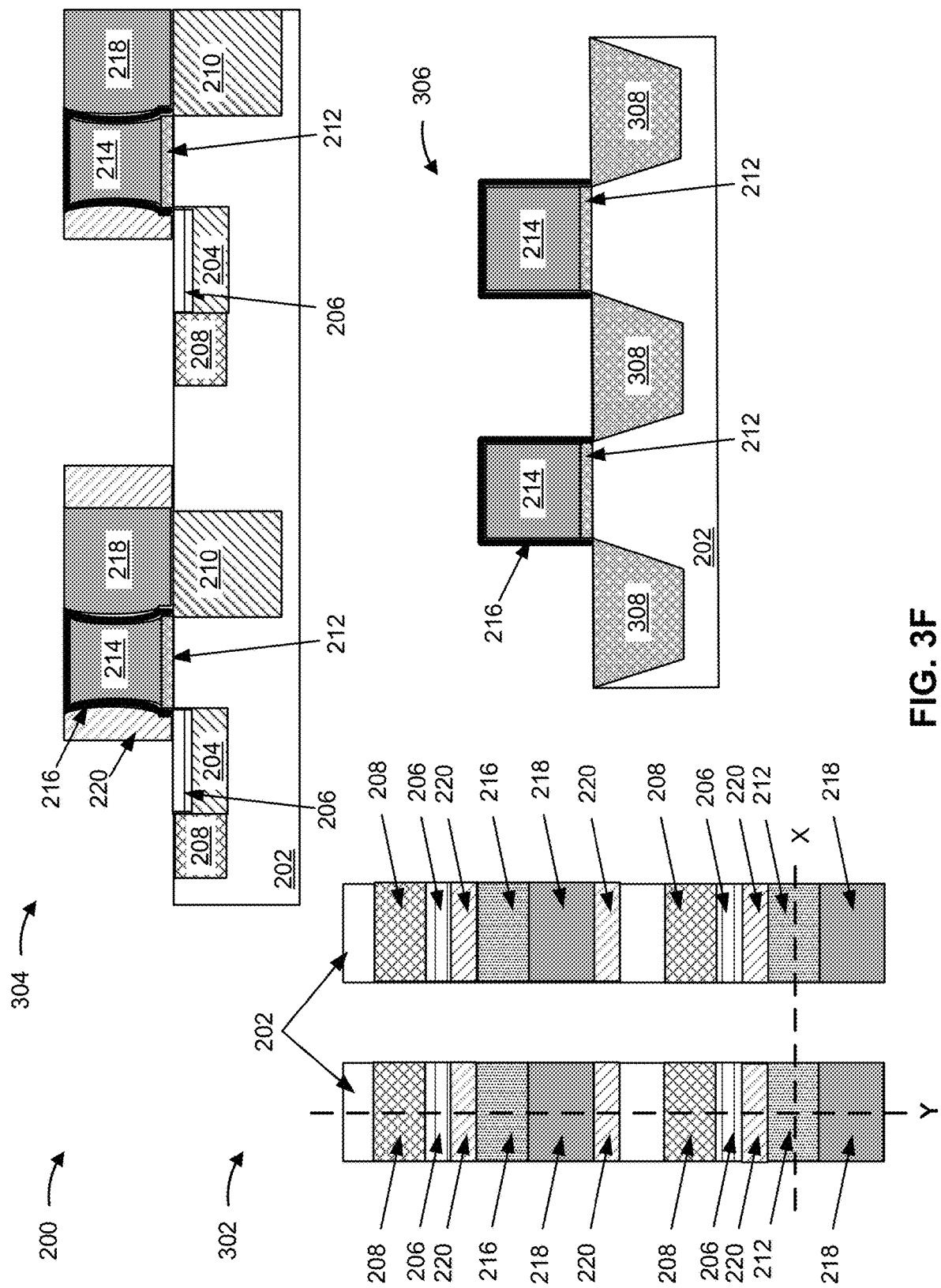

As shown in FIG. 3F, semiconductor structure 200 may include forming a conductive structure 218 (e.g., a gate) on the isolation structure 210. In some implementations, a deposition tool (e.g., deposition tool 102) may deposit the conductive structure 218 on the isolation structure 210. The deposition tool may deposit the conductive structure 218 adjacent to a curved side surface of the conductive structure 214 with the dielectric structure 216 disposed between a curved side surface of the conductive structure 218 and the curved side surface of the conductive structure 214. The dielectric structure 216 may provide an electrically insulating barrier between the conductive structures 214 and 218 to support storage of charges within one or more of the conductive structures 214 or 218, instead of discharging into one of the other conductive structures 214 or 218. In this way, application of different voltages to the conductive structures 214 and 218 may cause the semiconductor structure 200 to perform operations of the semiconductor structure 200, such as programming, erasing, and/or reading.

In some implementations, deposition of the conductive structure 218 may include a set of processes including forming a dielectric layer, forming a recess within the dielectric layer, depositing the conductive structure 218 into the recess, and/or removing the dielectric layer. In some implementations, a planarization tool (e.g., planarization tool 106) may polish and/or planarize a top surface of the conductive structure 218 during a deposition process.

As further shown in FIG. 3F, semiconductor structure 200 may include forming one or more spacers 220 adjacent to the conductive structure 214 (e.g., in contact with the dielectric structure 216 and/or on the LDD portion 206 of the substrate 202) and/or adjacent to the conductive structure 218 on the substrate 202. In some implementations, a deposition tool (e.g., deposition tool 102) may deposit the one or more spacers 220 adjacent to the conductive structure 214 and/or adjacent to the conductive structure 218 on the substrate 202 to provide structural support, an electromigration barrier, and/or electrical insulation to the conductive structures 214 and/or 218.

Figure 3G:
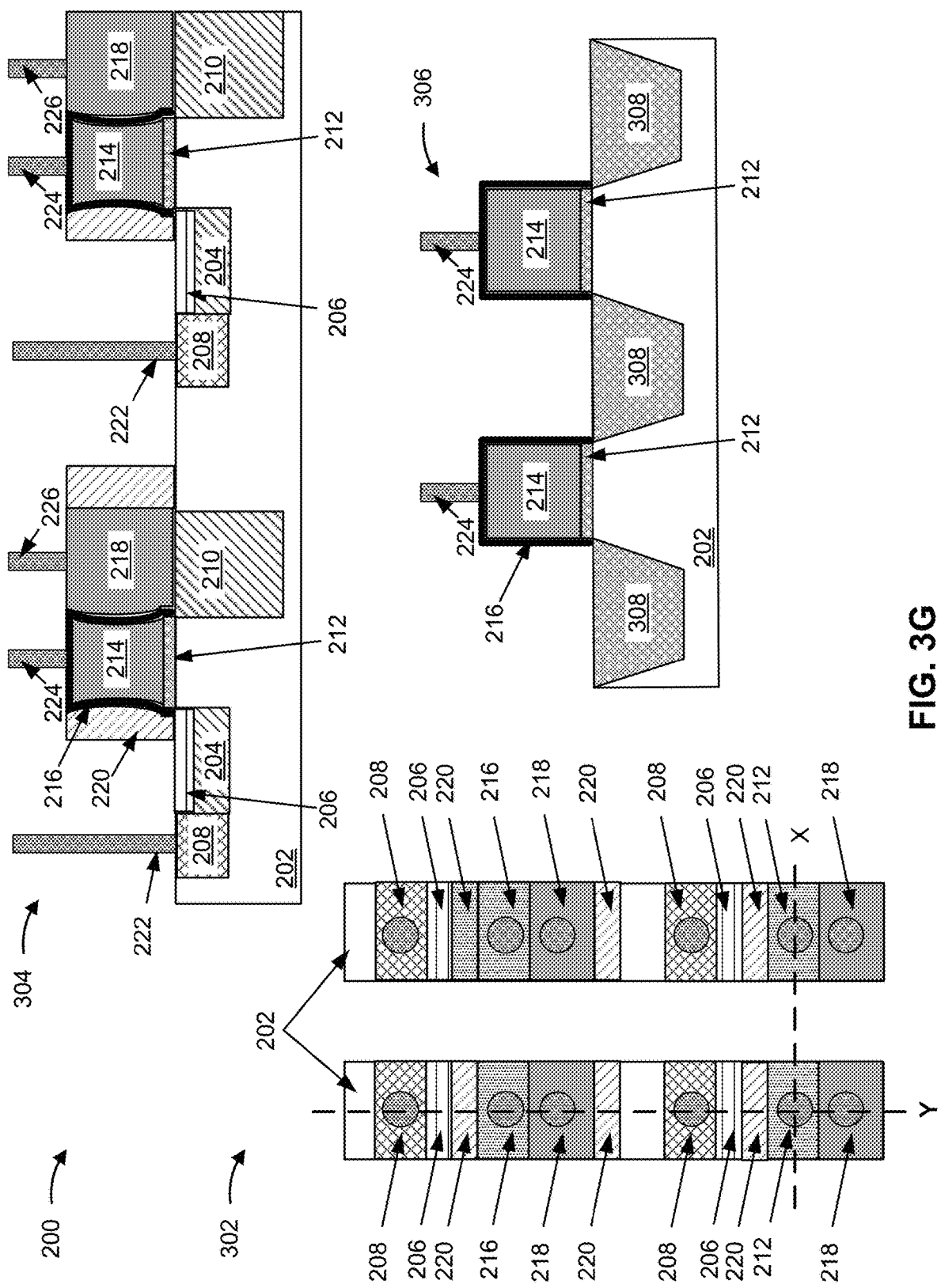

As shown in FIG. 3G, semiconductor structure 200 may include forming conductive structures 222, 224, and 226 on components of the semiconductor structure 200. In some implementations, a deposition tool (e.g., deposition tool 102) may deposit the conductive structure 222 on the source/drain 208, the conductive structure 224 on the dielectric structure 216 above the conductive structure 214, and the conductive structure 226 on the conductive structure 218. The deposition tool may deposit the conductive structures 222, 224, and 226 to provide electrical connections (e.g., electrical pathways) to the components of the semiconductor structure 200. In this way, the semiconductor structure 200 may receive different voltages for the conductive structures 214 and 218 and/or the source/drain 208 to cause the semiconductor structure 200 to perform operations of the semiconductor structure 200, such as programming, erasing, and/or reading.

Figure 3H:
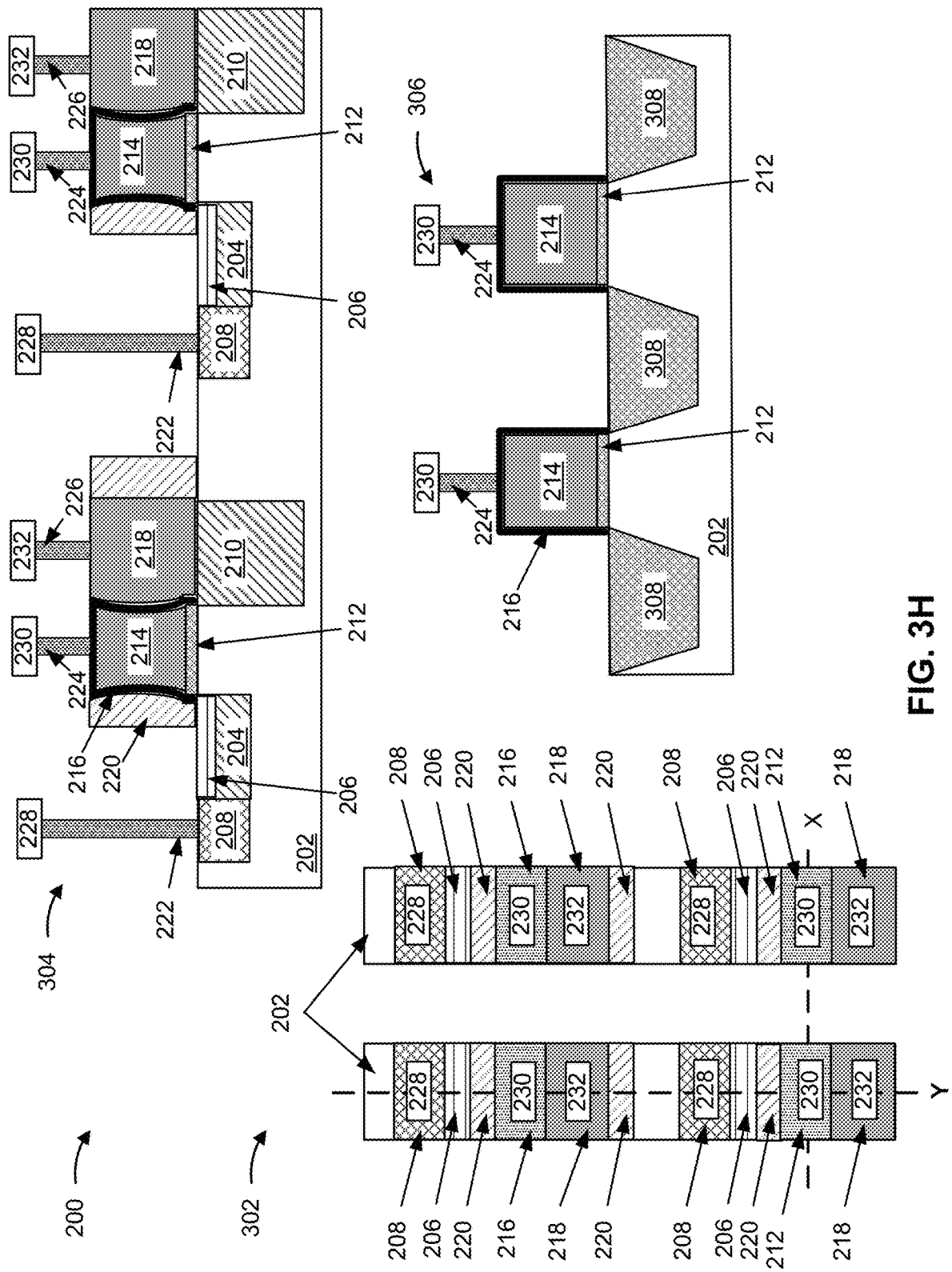

As shown in FIG. 3H, semiconductor structure 200 may include forming conductive structures (e.g., electrodes) 228, 230, and 232 on the conductive structures 222, 224, and 226. In some implementations, a deposition tool (e.g., deposition tool 102) may deposit the conductive structure 228 on the conductive structure 222, conductive structure 230 on the conductive structure 224, and conductive structure 232 on the conductive structure 226. The deposition tool may deposit the conductive structures 228, 230, and 232 to provide electrical connections (e.g., electrical pathways) to the conductive structures 222, 224, and 226. In this way, the semiconductor structure 200 may receive different voltages for the conductive structures 214 and 218 and/or the source/drain 208 to cause the semiconductor structure 200 to perform operations of the semiconductor structure 200, such as programming, erasing, and/or reading.

As indicated above, FIGS. 3A-3H are provided as an example. Other examples may differ from what is described with regard to FIGS. 3A-3H. The number and arrangement of devices, layers, and/or materials shown in FIGS. 3A-3H are provided as an example. In practice, there may be additional devices, layers, and/or materials, fewer devices, layers, and/or materials, different devices, layers, and/or materials, or differently arranged devices, layers, and/or materials than those shown in FIGS. 3A-3H. For example, one or more inter-layer dielectric layers or inter-metal dielectric layers may be disposed between structures shown in FIGS. 3A-3H.

Figure 4:
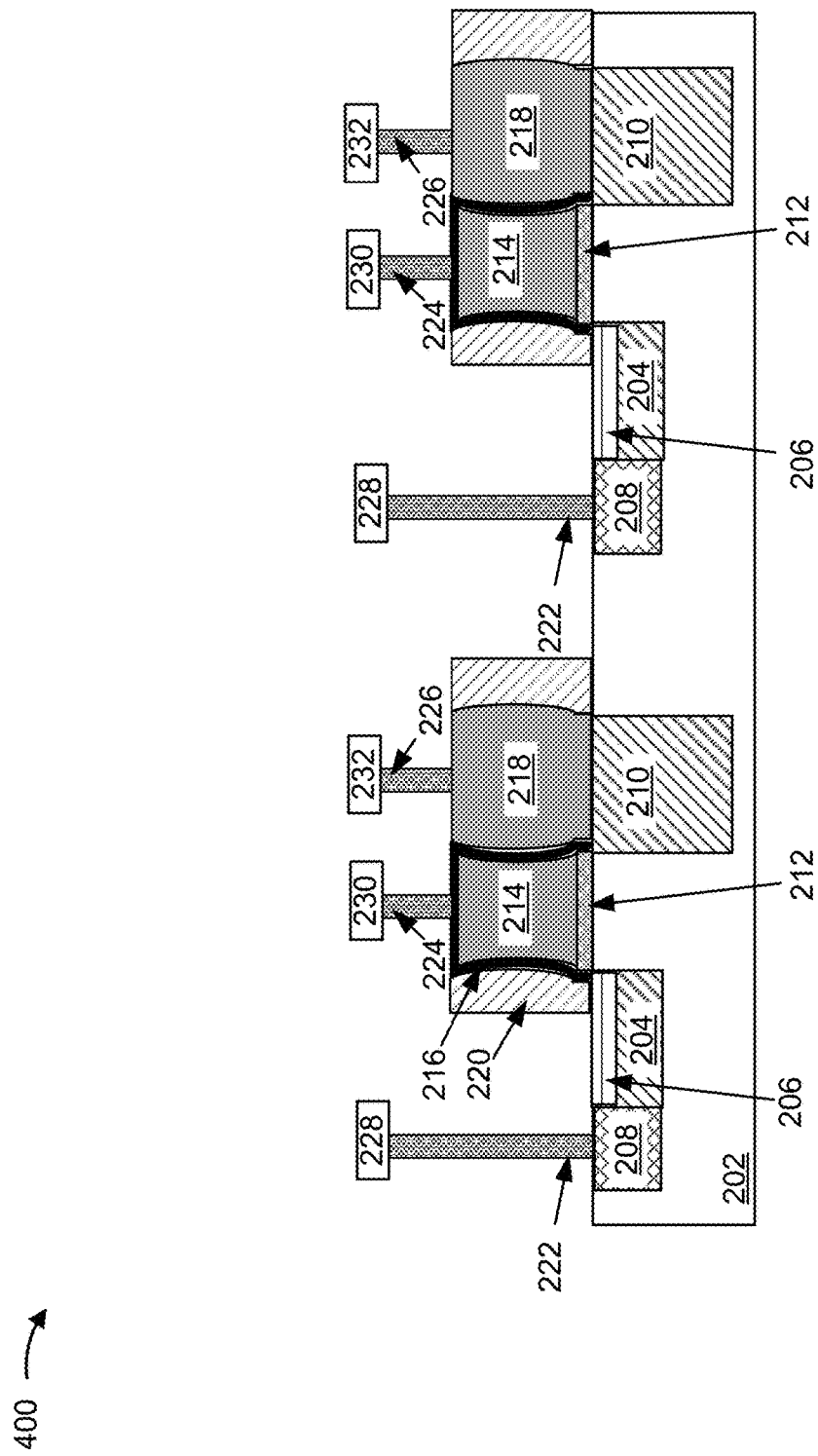
FIGS. 4-8 are diagrams of example semiconductor structures described herein.

FIG. 4 is a diagram of an example semiconductor structure 400 described herein. FIG. 4 shows a variation of a shape of the gate 214 and/or the gate 218 of FIG. 2. In some implementations, the semiconductor structure 400 includes one or more layers not shown in FIG. 4, such as one or more barrier layers, adhesion layers, metal gates, substrates, interconnects, recesses (e.g., vias), or semiconductor structures, among other examples. In some implementations, the semiconductor structure 400 includes one or more materials, structures, and/or layers as described herein in connection with FIGS. 2-3H.

The semiconductor structure 400 may include the substrate 202 having the doped portion 204, the LDD portion 206, the source/drain 208, and the isolation structure 210 (e.g., as described herein). The semiconductor structure 400 may also include the tunneling layer 212, the conductive structures 214 and 218, the dielectric structure 216, and the one or more spacers 220. The semiconductor structure 400 may further include the conductive structures 222, 224, 226, 228, 230, and 232 (e.g., as described herein).

As shown in FIG. 4, the conductive structure 214 is formed with a first concave surface (e.g., a curved side surface) facing a first convex surface of the conductive structure 218, with the dielectric structure 216 disposed between the first concave surface of the conductive structure 214 and the first convex surface of the conductive structure 218. The conductive structure 214 is also formed with a second concave surface opposite the first concave surface and facing a first spacer 220 and/or the source/drain 208. The conductive structure 218 is also formed with a second convex surface opposite the first convex surface and facing a second spacer 220 (e.g., opposite from the first spacer) and/or away from the source/drain 208.

Based on the conductive structure 214 having opposite concave side surfaces, manufacturing processes may be simplified by applying a same deposition and/or etching process to both side surfaces of the conductive structure 214. Similarly, based on the conductive structure 218 having opposite convex side surfaces, manufacturing processes may be simplified by applying a same deposition and/or etching process to both side surfaces of the conductive structure 218.

As indicated above, FIG. 4 is provided as an example. Other examples may differ from what is described with regard to FIG. 4.

Figure 5:
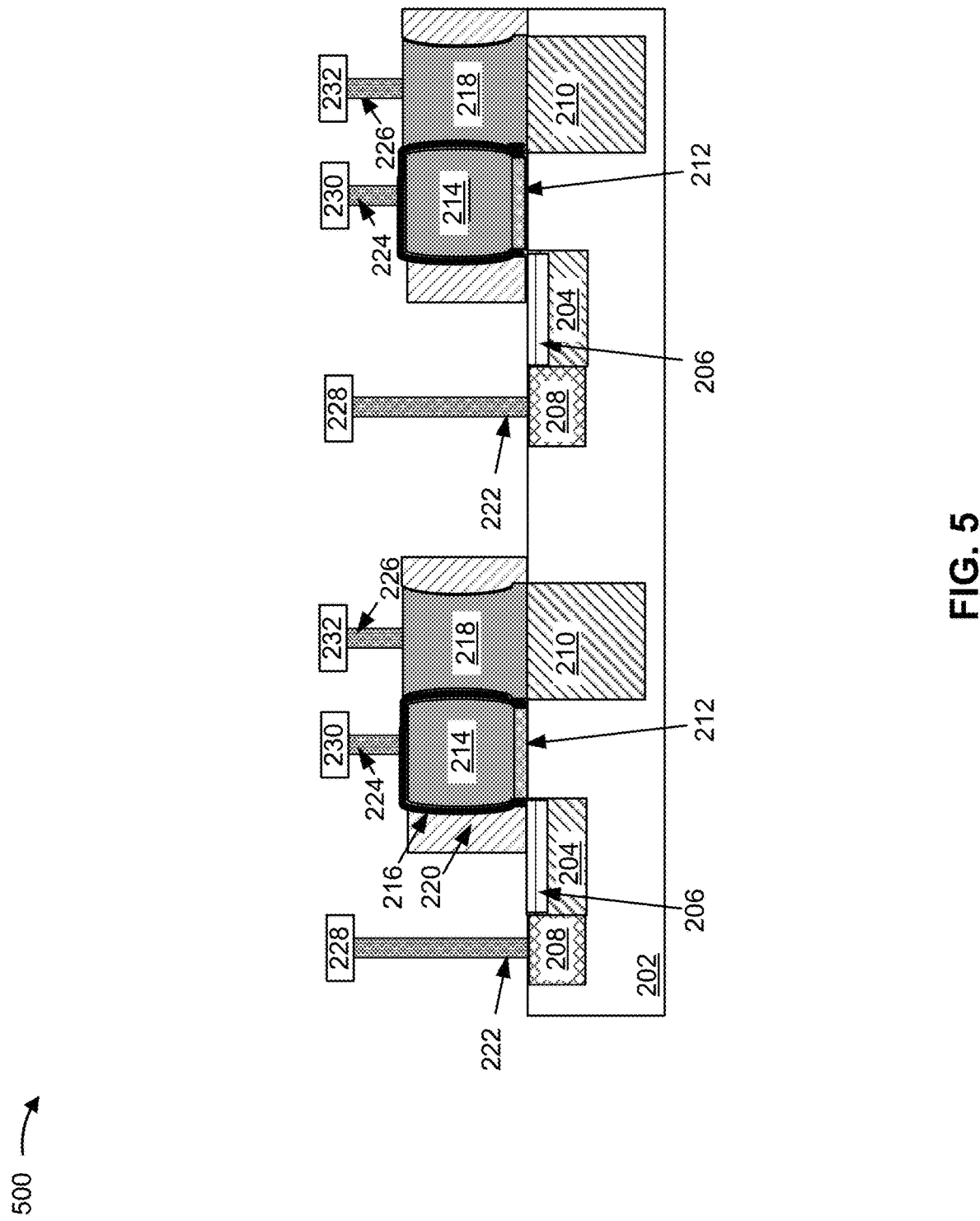

FIG. 5 is a diagram of an example semiconductor structure 500 described herein. FIG. 5 shows another variation of a shape of the gate 214 and/or the gate 218 of FIG. 2. In some implementations, the semiconductor structure 500 includes one or more layers not shown in FIG. 5, such as one or more barrier layers, adhesion layers, metal gates, substrates, interconnects, recesses (e.g., vias), or semiconductor structures, among other examples. In some implementations, the semiconductor structure 500 includes one or more materials, structures, and/or layers as described herein in connection with FIGS. 2-3H.

The semiconductor structure 500 may include the substrate 202 having the doped portion 204, the LDD portion 206, the source/drain 208, and the isolation structure 210 (e.g., as described herein). The semiconductor structure 500 may also include the tunneling layer 212, the conductive structures 214 and 218, the dielectric structure 216, and the one or more spacers 220. The semiconductor structure 500 may further include the conductive structures 222, 224, 226, 228, 230, and 232 (e.g., as described herein).

As shown in FIG. 5, the conductive structure 214 is formed with a first convex surface (e.g., a curved side surface) facing a first concave surface of the conductive structure 218, with the dielectric structure 216 disposed between the first convex surface of the conductive structure 214 and the first concave surface of the conductive structure 218. The conductive structure 214 is also formed with a second convex surface opposite the first convex surface and facing a first spacer 220 and/or the source/drain 208. The conductive structure 218 is also formed with a second concave surface opposite the first concave surface and facing a second spacer 220 (e.g., opposite from the first spacer) and/or away from the source/drain 208.

Based on the conductive structure 214 having opposite convex side surfaces, manufacturing processes may be simplified by applying a same deposition and/or etching process to both side surfaces of the conductive structure 214. Similarly, based on the conductive structure 218 having opposite concave side surfaces, manufacturing processes may be simplified by applying a same deposition and/or etching process to both side surfaces of the conductive structure 218.

As indicated above, FIG. 5 is provided as an example. Other examples may differ from what is described with regard to FIG. 5.

Figure 6:
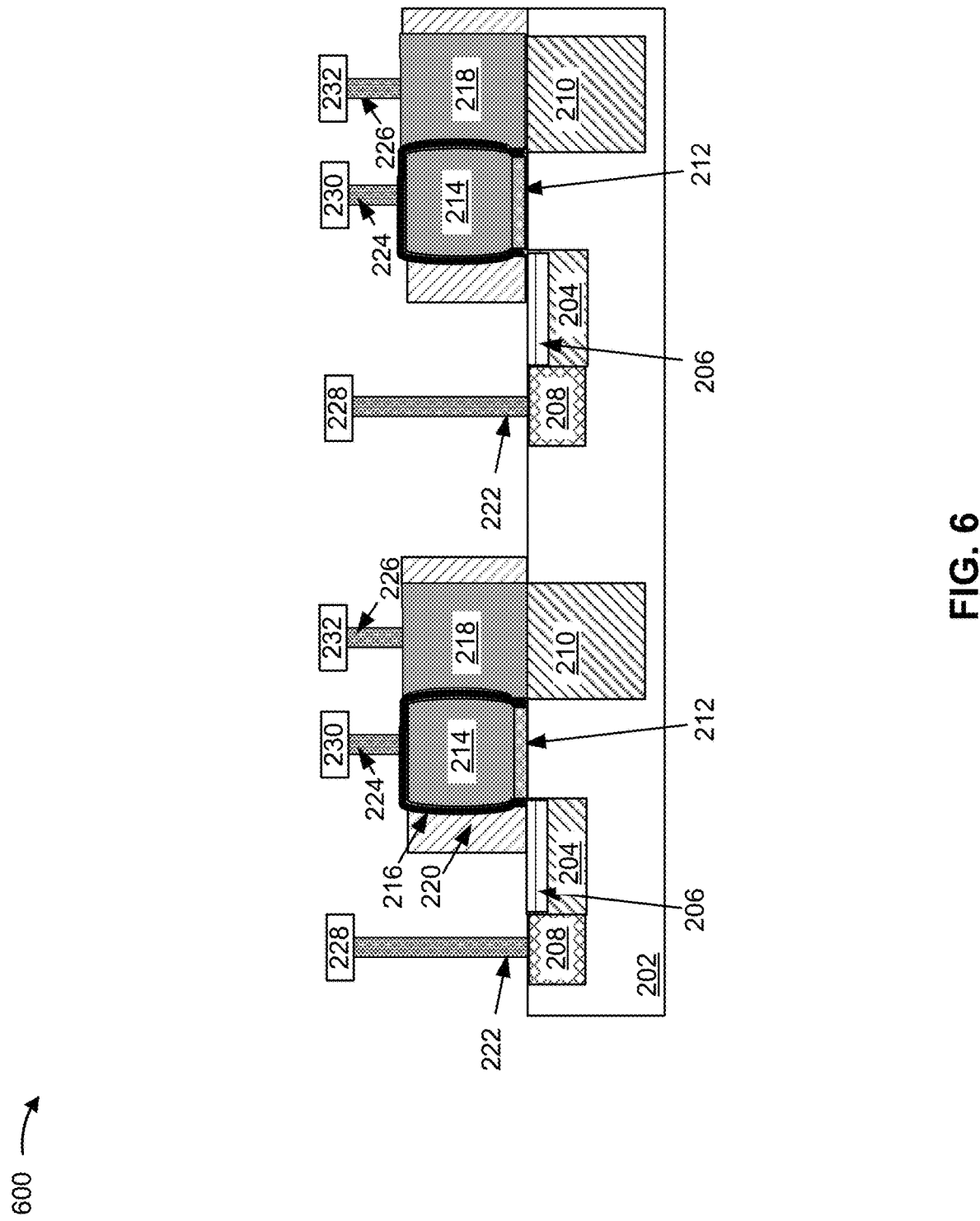

FIG. 6 is a diagram of an example semiconductor structure 600 described herein. FIG. 6 shows another variation of a shape of the gate 214 and/or the gate 218 of FIG. 2. In some implementations, the semiconductor structure 600 includes one or more layers not shown in FIG. 6, such as one or more barrier layers, adhesion layers, metal gates, substrates, interconnects, recesses (e.g., vias), or semiconductor structures, among other examples. In some implementations, the semiconductor structure 600 includes one or more materials, structures, and/or layers as described herein in connection with FIGS. 2-3H.

The semiconductor structure 600 may include the substrate 202 having the doped portion 204, the LDD portion 206, the source/drain 208, and the isolation structure 210 (e.g., as described herein). The semiconductor structure 600 may also include the tunneling layer 212, the conductive structures 214 and 218, the dielectric structure 216, and the one or more spacers 220. The semiconductor structure 600 may further include the conductive structures 222, 224, 226, 228, 230, and 232 (e.g., as described herein.

As shown in FIG. 6, the conductive structure 214 is formed with a first convex surface (e.g., a curved side surface) facing a concave surface of the conductive structure 218, with the dielectric structure 216 disposed between the first convex surface of the conductive structure 214 and the concave surface of the conductive structure 218. The conductive structure 214 is also formed with a second convex surface opposite the first convex surface and facing a first spacer 220 and/or the source/drain 208. The conductive structure 218 is also formed with a generally planar surface opposite the concave surface and facing a second spacer 220 (e.g., opposite from the first spacer) and/or away from the source/drain 208.

Based on the conductive structure 214 having opposite convex side surfaces, manufacturing processes may be simplified by applying a same deposition and/or etching process to both side surfaces of the conductive structure 214. Based on the conductive structure 218 having the generally planar surface opposite from the concave side surface, manufacturing processes may be simplified by filling a volume adjacent to the conductive structure 214 to form the concave side surface and applying a generally planar etching process to form the generally planar surface opposite from the concave side surface.

As indicated above, FIG. 6 is provided as an example. Other examples may differ from what is described with regard to FIG. 6.

Figure 7:
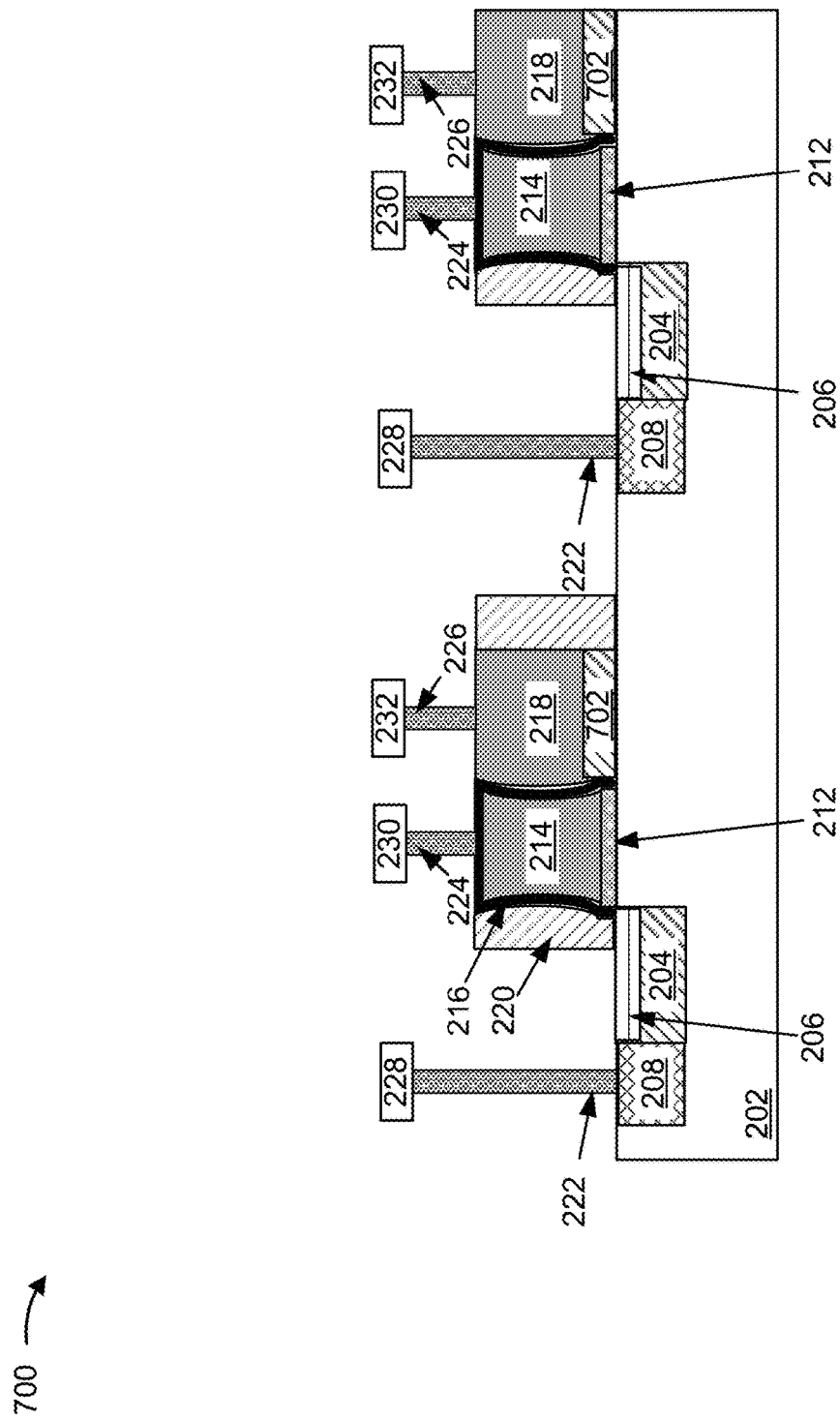

FIG. 7 is a diagram of an example semiconductor structure 700 described herein. FIG. 7 shows another variation of a shape of the gate 214 and/or the gate 218 of FIG. 2. In some implementations, the semiconductor structure 700 includes one or more layers not shown in FIG. 7, such as one or more barrier layers, adhesion layers, metal gates, substrates, interconnects, recesses (e.g., vias), or semiconductor structures, among other examples. In some implementations, the semiconductor structure 700 includes one or more materials, structures, and/or layers as described herein in connection with FIGS. 2-3H.

The semiconductor structure 700 may include the substrate 202 having the doped portion 204, the LDD portion 206, and the source/drain 208 (e.g., as described herein). The semiconductor structure 700 may also include the tunneling layer 212, the conductive structures 214 and 218, the dielectric structure 216, and the one or more spacers 220. The semiconductor structure 700 may further include the conductive structures 222, 224, 226, 228, 230, and 232 (e.g., as described herein.

As shown in FIG. 7, the semiconductor structure 700 may include an isolation structure 702 (e.g., in place of the isolation structure 210 of FIGS. 2-3H) disposed on a top surface of the substrate 202. In some implementations, the isolation structure 702 may provide electrical insulation between the conductive structure 218 above the isolation structure 702 and the substrate 202 below the isolation structure 702. A thickness (e.g., a height) of the conductive structure 218 may be reduced when compared to the conductive structure 218 of FIG. 2. In some implementations, a combined thickness of the conductive structure 218 and the isolation structure 702 may be approximately equal to a thickness of the conductive structure 218 of the semiconductor structure 200 of FIG. 2. In some implementations, a sum of thicknesses of the isolation structure 702 and the conductive structure 218, and a sum of thicknesses of the tunneling layer 212 and the conductive structure 214 and the dielectric structure 216 may be approximately equal.

Based on the isolation structure 702 being disposed on the top surface of the substrate 202, a process of forming the semiconductor structure 700 may have a reduced number of operations by avoiding operations relating to forming a trench structure within the substrate 202.

As indicated above, FIG. 7 is provided as an example. Other examples may differ from what is described with regard to FIG. 7.

Figure 8:
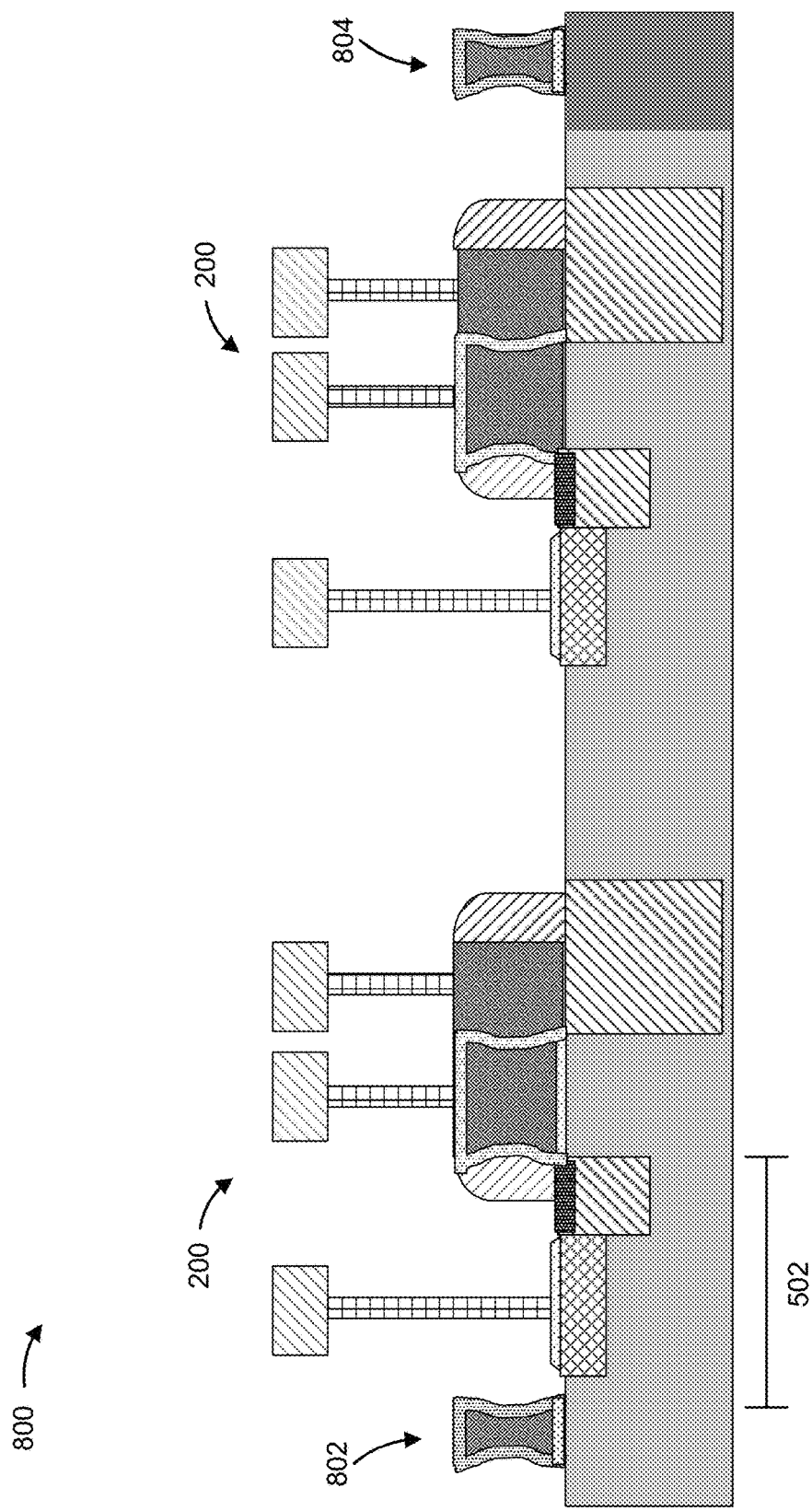

FIG. 8 is a diagram of an example semiconductor structure 800 described herein. FIG. 8 shows another variation of a shape of the gate 214 and/or the gate 218 of FIG. 2. In some implementations, the semiconductor structure 800 includes one or more layers not shown in FIG. 8 such as one or more barrier layers, adhesion layers, metal gates, substrates, interconnects, recesses (e.g., vias), or semiconductor structures, among other examples. In some implementations, the semiconductor structure 800 includes one or more materials, structures, and/or layers as described herein in connection with FIGS. 2-3H.

As shown in FIG. 8, the semiconductor structure 800 includes multiple semiconductor structures 200 (e.g., as shown in FIGS. 2-3H) and multiple additional conductive structures 802 and 804. In some implementations, the semiconductor structures 200 may include one or more features described in connection with one or more of FIGS. 2-7 (e.g., shapes of conductive structures 214 and/or 218 and/or positions of the isolation structure 210). In some implementations, the one or more additional conductive structures 802 and 804 may be positioned on opposite sides of a set of semiconductor structures 200. For example, the additional conductive structure 802 may be positioned on a first end of a row of multiple semiconductor structures 200 and the additional conductive structure 804 may be positioned on a second end of the row of multiple semiconductor structures 200.

In some implementations, the additional conductive structure 802 may be positioned in a range of approximately 8 micrometers to 12 micrometers from a conductive structure 214 of a nearest semiconductor structure 200 on the first end to provide sufficient lateral separation from the semiconductor structure 200 and also to reduce the isolation and/or dense bias effect on the first end of the semiconductor structure 200. Similarly, the additional conductive structure 804 may be positioned in a range of approximately 3 micrometers to 7 micrometers from a conductive structure 214 of a nearest semiconductor structure 200 on the second end to provide sufficient lateral separation from the semiconductor structure 200 (e.g., to avoid overlapping the isolation structure 210) and also to reduce the isolation and/or dense bias effect on the second end of the semiconductor structure 200

As indicated above, FIG. 8 is provided as an example. Other examples may differ from what is described with regard to FIG. 8.

Figure 9:
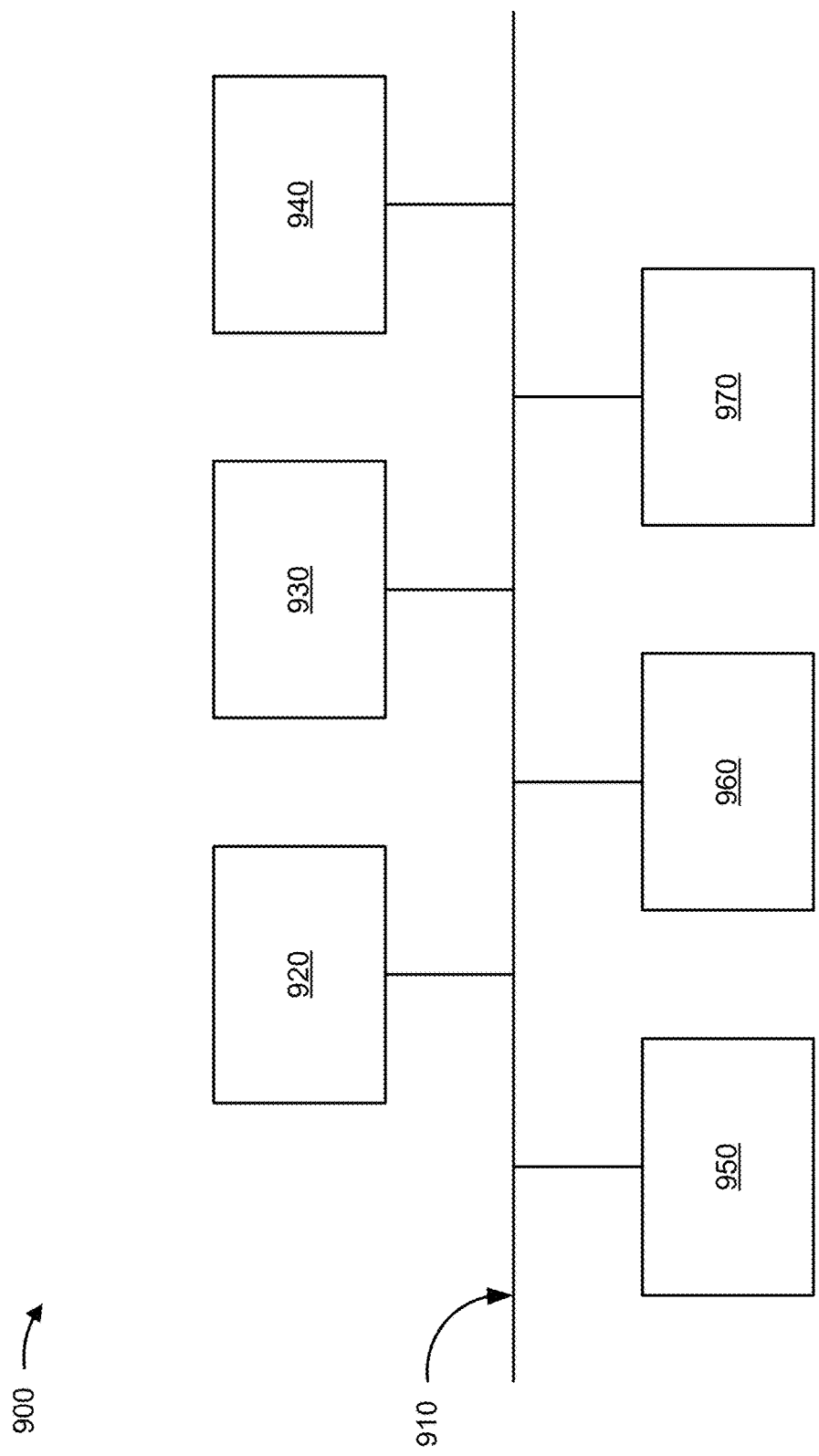
FIG. 9 is a diagram of example components of one or more devices of FIG. 1.

FIG. 9 is a diagram of example components of a device 900, which may correspond to deposition tool 102, etching tool 104, planarization tool 106, ion implantation tool 108, and/or wafer/die transport tool 110. In some implementations, deposition tool 102, etching tool 104, planarization tool 106, ion implantation tool 108, and/or wafer/die transport tool 110 include one or more devices 900 and/or one or more components of device 900. As shown in FIG. 9, device 900 may include a bus 910, a processor 920, a memory 930, a storage component 940, an input component 950, an output component 960, and a communication component 970.

Bus 910 includes a component that enables wired and/or wireless communication among the components of device 900. Processor 920 includes a central processing unit, a graphics processing unit, a microprocessor, a controller, a microcontroller, a digital signal processor, a field-programmable gate array, an application-specific integrated circuit, and/or another type of processing component. Processor 920 is implemented in hardware, firmware, or a combination of hardware and software. In some implementations, processor 920 includes one or more processors capable of being programmed to perform a function. Memory 930 includes a random access memory, a read only memory, and/or another type of memory (e.g., a flash memory, a magnetic memory, and/or an optical memory).

Storage component 940 stores information and/or software related to the operation of device 900. For example, storage component 940 may include a hard disk drive, a magnetic disk drive, an optical disk drive, a solid state disk drive, a compact disc, a digital versatile disc, and/or another type of non-transitory computer-readable medium. Input component 950 enables device 900 to receive input, such as user input and/or sensed inputs. For example, input component 950 may include a touch screen, a keyboard, a keypad, a mouse, a button, a microphone, a switch, a sensor, a global positioning system component, an accelerometer, a gyroscope, and/or an actuator. Output component 960 enables device 900 to provide output, such as via a display, a speaker, and/or one or more light-emitting diodes. Communication component 970 enables device 900 to communicate with other devices, such as via a wired connection and/or a wireless connection. For example, communication component 970 may include a receiver, a transmitter, a transceiver, a modem, a network interface card, and/or an antenna.

Device 900 may perform one or more processes described herein. For example, a non-transitory computer-readable medium (e.g., memory 930 and/or storage component 940) may store a set of instructions (e.g., one or more instructions, code, software code, and/or program code) for execution by processor 920. Processor 920 may execute the set of instructions to perform one or more processes described herein. In some implementations, execution of the set of instructions, by one or more processors 920, causes the one or more processors 920 and/or the device 900 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 9 are provided as an example. Device 900 may include additional components, fewer components, different components, or differently arranged components than those shown in FIG. 9. Additionally, or alternatively, a set of components (e.g., one or more components) of device 900 may perform one or more functions described as being performed by another set of components of device 900.

Figure 10:
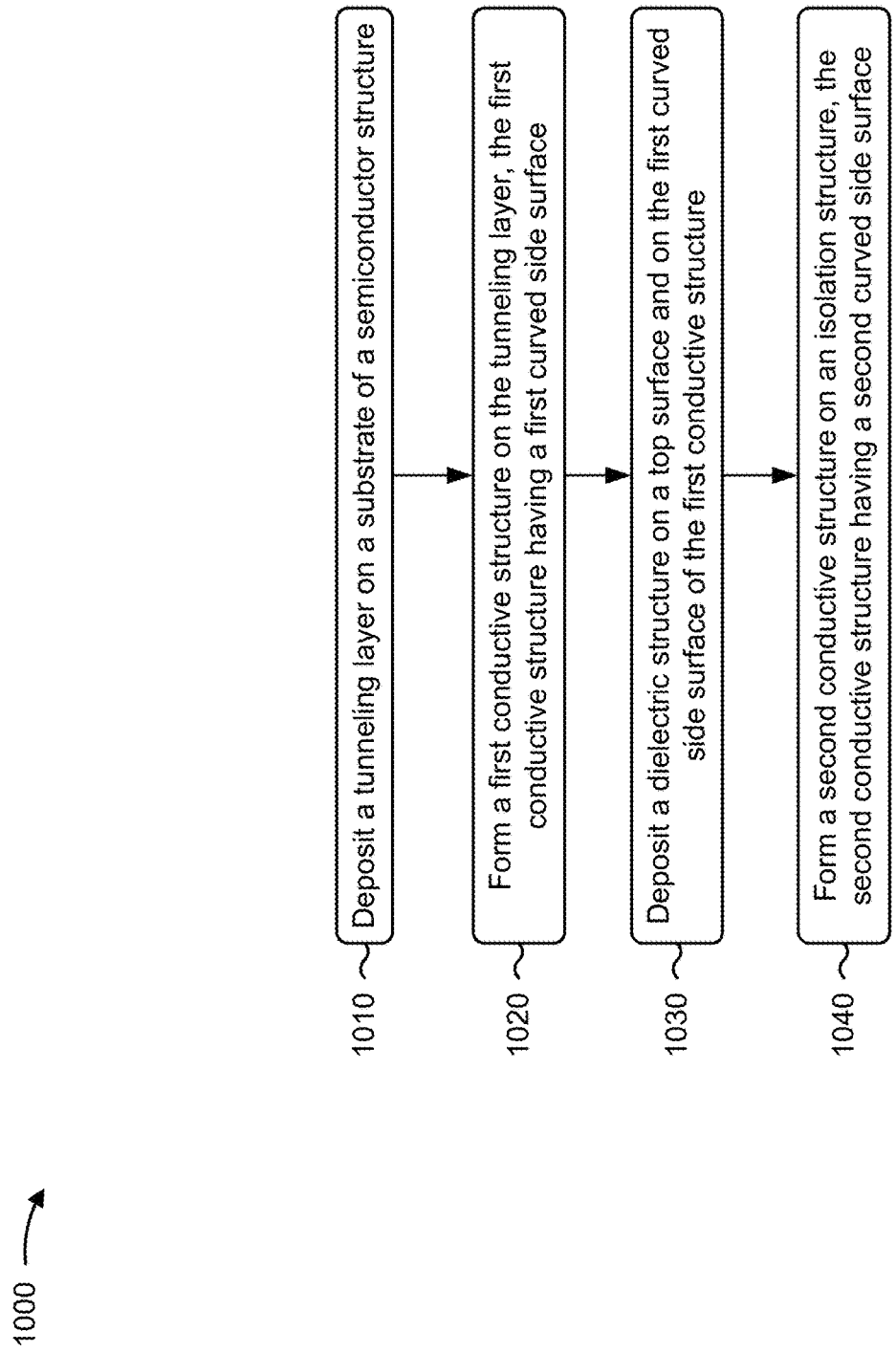
FIG. 10 is a flowchart of an example process relating to forming a semiconductor structure described herein.

FIG. 10 is a flowchart of an example process 1000 relating to forming a semiconductor structure described herein. In some implementations, one or more process blocks of FIG. 10 may be performed by one or more semiconductor processing tools (e.g., deposition tool 102, etching tool 104, planarization tool 106, ion implantation tool 108, and/or wafer/die transport tool 110). Additionally, or alternatively, one or more process blocks of FIG. 10 may be performed by one or more components of device 900, such as processor 920, memory 930, storage component 940, input component 950, output component 960, and/or communication component 970.

As shown in FIG. 10, process 1000 may include depositing a tunneling layer on a substrate of a semiconductor structure (block 1010). For example, the one or more semiconductor processing tools may deposit a tunneling layer 212 on a substrate 202 of a semiconductor structure 200, as described above.

As further shown in FIG. 10, process 1000 may include forming a first conductive structure on the tunneling layer, the first conductive structure having a first curved side surface (block 1020). For example, the one or more semiconductor processing tools may form a first conductive structure 214 on the tunneling layer 212, the first conductive structure having a first curved side surface, as described above.

As further shown in FIG. 10, process 1000 may include depositing a dielectric structure on a top surface and on the first curved side surface of the first conductive structure (block 1030). For example, the one or more semiconductor processing tools may deposit a dielectric structure 216 on a top surface and on the first curved side surface of the first conductive structure 214, as described above.

As further shown in FIG. 10, process 1000 may include forming a second conductive structure on an isolation structure, the second conductive structure having a second curved side surface, (block 1040). For example, the one or more semiconductor processing tools may form a second conductive structure 218 on an isolation structure 210 the second conductive structure 218 having a second curved side surface, as described above. In some implementations, the dielectric structure 216 is disposed between the first curved side surface and the second curved side surface.

Process 1000 may include additional implementations, such as any single implementation or any combination of implementations described below and/or in connection with one or more other processes described elsewhere herein.

In a first implementation, process 1000 includes forming a source/drain on the substrate that is laterally displaced from the first conductive structure and the second conductive structure.

In a second implementation, alone or in combination with the first implementation, process 1000 includes forming a third conductive structure on the substrate, wherein depositing the third conductive structure comprises depositing the third conductive structure in a same deposition process as depositing the first conductive structure.

In a third implementation, alone or in combination with one or more of the first and second implementations, a distance from the third conductive structure to the first conductive structure is in a range of approximately 8 micrometers to 12 micrometers.

In a fourth implementation, alone or in combination with one or more of the first through third implementations, process 1000 includes forming, before depositing the tunneling layer on the substrate, a lightly doped drain within the substrate between a source/drain and the first conductive structure.

In a fifth implementation, alone or in combination with one or more of the first through fourth implementations, process 1000 includes forming, before depositing the second conductive structure, the isolation structure based on doping a portion of the substrate to increase an impedance of the portion of the substrate.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

In this way, the first conductive structure may have a curved side surface that interfaces with a curved side surface of the second conductive structure, which may form an interface between the first conductive structure and the second conductive structure having an increased surface area in comparison with a planar interface. The increased surface area may improve coupling, decrease impedance (e.g., resistance) at the interface, and/or reduce a voltage difference between the conductive structures required to perform a transistor operation (e.g., an erasing operation). Additionally, or alternatively, based on the conductive structures being arranged laterally with different terminals, the semiconductor structure may be configured to perform one or more operations based on providing a voltage difference across the dielectric structure, instead of based on providing a voltage difference across the tunneling oxide. This may reduce stress on the tunneling oxide, which may increase a life cycle of the semiconductor structure.

As described in greater detail above, some implementations described herein provide a semiconductor structure. The semiconductor structure includes a first terminal coupled to a substrate of the semiconductor structure. The first terminal comprises a tunneling layer formed on the substrate, a first conductive structure formed on the tunneling layer, and a dielectric structure formed on a top surface and on the first curved side surface of the first conductive structure. The first conductive structure has a first curved side surface. The semiconductor structure includes a second terminal coupled to the substrate. The second terminal comprises a second conductive structure formed on an isolation structure. The second conductive structure has a second curved side surface, and the dielectric structure is disposed between the first curved side surface and the second curved side surface.

As described in greater detail above, some implementations described herein provide a semiconductor structure. The semiconductor structure includes a first terminal coupled to a substrate of the semiconductor structure. The first terminal comprises a tunneling layer formed on the substrate, a first gate formed on the tunneling layer, and a dielectric structure formed on a top surface and on the first curved side surface of the first gate. The first gate has a first curved side surface. The semiconductor structure includes a second terminal coupled to the substrate and adjacent to the first terminal. The second terminal comprises a second gate formed on an isolation structure. The second gate has a second curved side surface formed adjacent to the dielectric structure at the first curved side surface. The semiconductor structure includes a third terminal coupled to a source/drain of the semiconductor structure.

As described in greater detail above, some implementations described herein provide a method. The method includes depositing a tunneling layer on a substrate of a semiconductor structure. The method includes forming a first conductive structure on the tunneling layer, the first conductive structure having a first curved side surface. The method includes depositing a dielectric structure on a top surface and on the first curved side surface of the first conductive structure. The method includes forming a second conductive structure on an isolation structure, the second conductive structure having a second curved side surface, where the dielectric structure is disposed between the first curved side surface and the second curved side surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
    a first terminal coupled to a substrate of the semiconductor structure, the first terminal comprising:
        a tunneling layer formed on the substrate,
        a first conductive structure formed on the tunneling layer, the first conductive structure having a first curved side surface, and
        a dielectric structure formed on a top surface and on the first curved side surface of the first conductive structure; and
    a second terminal coupled to the substrate, the second terminal comprising:
        a second conductive structure formed on an isolation structure, the second conductive structure having a second curved side surface,
        wherein the dielectric structure is disposed between the first curved side surface and the second curved side surface.

2. The semiconductor structure of claim 1, wherein the first curved side surface comprises a concave side surface, and
    wherein the second curved side surface comprises a convex side surface.

3. The semiconductor structure of claim 2, wherein the first conductive structure has a first width in a top portion of the first conductive structure,
    wherein the first conductive structure has a second width in a middle portion of the first conductive structure, and
    wherein the first width is at least 6% greater than the second width.

4. The semiconductor structure of claim 2, wherein the first conductive structure has a first width in a bottom portion of the first conductive structure,
    wherein the first conductive structure has a second width in a middle portion of the first conductive structure, and
    wherein the first width is at least 3% greater than the second width.

5. The semiconductor structure of claim 1, wherein the first curved side surface comprises a convex side surface, and
    wherein the second curved side surface comprises a concave side surface.

6. The semiconductor structure of claim 1, wherein the isolation structure comprises:
   an anti-punch through structure,
   a shallow trench isolation structure,
   a deep trench isolation structure, or
   an insulating material disposed on a top surface of the substrate.

7. The semiconductor structure of claim 1, wherein the isolation structure is configured to provide an electrical resistance between the second conductive structure and the substrate that is greater than an electrical resistance provided by the dielectric structure between the second conductive structure and the first conductive structure.

8. The semiconductor structure of claim 1, wherein one or more of the first conductive structure or the second conductive structure comprise a polysilicon material.

9. The semiconductor structure of claim 1, wherein a top portion of the dielectric structure and the second conductive structure extend to approximately a same height relative to a top surface of the substrate of the semiconductor structure.

10. The semiconductor structure of claim 1, wherein the dielectric structure comprises:
    a first oxide-based layer,
    a silicon nitride-based layer, and
    a second oxide-based layer.

11. The semiconductor structure of claim 1, wherein the tunneling layer comprises a tunneling oxide material.

12. A semiconductor structure comprising:
    a first terminal coupled to a substrate of the semiconductor structure, the first terminal comprising:
        a tunneling layer formed on the substrate,
        a first gate formed on the tunneling layer, the first gate having a first curved side surface, and
        a dielectric structure formed on a top surface and on the first curved side surface of the first gate;
    a second terminal coupled to the substrate and adjacent to the first terminal, the second terminal comprising:
        a second gate formed on an isolation structure, the second gate having a second curved side surface formed adjacent to the dielectric structure at the first curved side surface; and
    a third terminal coupled to a source/drain of the semiconductor structure.

13. The semiconductor structure of claim 12, wherein the first curved side surface comprises a first concave surface of the first gate,
    wherein the first gate comprises a second concave surface opposite the first concave surface, and
    wherein the second curved side surface comprises a convex surface.

14. The semiconductor structure of claim 12, wherein the second curved side surface comprises a first concave surface of the second gate,
    wherein the second gate comprises a second concave surface opposite the first concave surface, and
    wherein the first curved side surface comprises a convex surface.

* * * * *